US012635581B2

(12) United States Patent
Chen et al.

(10) Patent No.: US 12,635,581 B2
(45) Date of Patent: May 19, 2026

(54) PACKAGE STRUCTURE AND METHOD FOR FORMING THE SAME

(71) Applicant: Taiwan Semiconductor Manufacturing Company, Ltd., Hsinchu (TW)

(72) Inventors: Wei-Yu Chen, Hsinchu cITY (TW); Chien-Hsun Lee, Hsin-chu County (TW)

(73) Assignee: Taiwan Semiconductor Manufacturing Company, Ltd., hSINCHU (TW)

( * ) Notice: Subject to any disclaimer, the term of this patent is extended or adjusted under 35 U.S.C. 154(b) by 567 days.

(21) Appl. No.: 18/167,095

(22) Filed: Feb. 10, 2023

(65) Prior Publication Data

US 2024/0213218 A1      Jun. 27, 2024

Related U.S. Application Data

(60) Provisional application No. 63/435,325, filed on Dec. 26, 2022.

(51) Int. Cl.
| | |
|---|---|
| *H01L 25/065* | (2023.01) |
| *H01L 21/56* | (2006.01) |
| *H01L 23/498* | (2006.01) |
| *H01L 23/538* | (2006.01) |
| *H10W 70/60* | (2026.01) |
| *H10W 70/65* | (2026.01) |
| *H10W 74/01* | (2026.01) |
| *H10W 90/00* | (2026.01) |
| *H01L 23/00* | (2006.01) |
| *H10W 70/63* | (2026.01) |
| *H10W 72/90* | (2026.01) |

(52) U.S. Cl.
CPC ......... *H10W 90/00* (2026.01); *H10W 70/614* (2026.01); *H10W 70/65* (2026.01); *H10W 74/016* (2026.01); *H10W 90/701* (2026.01); *H10W 70/635* (2026.01); *H10W 72/942* (2026.01)

(58) Field of Classification Search
CPC .................................................. H01L 25/0657
See application file for complete search history.

(56) References Cited

U.S. PATENT DOCUMENTS

| | | | | |
|---|---|---|---|---|
| 5,696,031 A | * | 12/1997 | Wark ................... | H01L 25/0657 257/E21.511 |
| 6,414,396 B1 | * | 7/2002 | Shim ................... | H01L 23/3114 257/737 |

(Continued)

*Primary Examiner* — William A Harriston
(74) *Attorney, Agent, or Firm* — JCIPRNET

(57) ABSTRACT

A package structure including a first semiconductor die, at least one second semiconductor die conductive terminals and an insulating encapsulation is provided. The at least one second semiconductor die is stacked on and electrically connected to the first semiconductor die. The conductive terminals are disposed on and electrically connected to the first semiconductor die. The insulating encapsulation laterally encapsulates the first semiconductor die, the at least one second semiconductor die and the conductive terminals, wherein the conductive terminals protrude from a surface of the insulating encapsulation. Furthermore, a method for forming the above-mentioned is also provided.

20 Claims, 23 Drawing Sheets

(56) References Cited

U.S. PATENT DOCUMENTS

| | | | | | |
|---|---|---|---|---|---|
| 6,475,897 | B1* | 11/2002 | Hosaka | .................. | H01L 24/11 |
| | | | | | 257/E23.021 |
| 7,569,920 | B2* | 8/2009 | Otremba | .............. | H01L 23/481 |
| | | | | | 257/E23.071 |
| 7,932,616 | B2* | 4/2011 | Meguro | ............... | H01L 25/105 |
| | | | | | 257/E23.141 |
| 8,138,014 | B2* | 3/2012 | Chi | ...................... | H01L 23/552 |
| | | | | | 438/106 |
| 8,993,380 | B2 | 3/2015 | Hou et al. | | |
| 9,281,254 | B2 | 3/2016 | Yu et al. | | |
| 9,299,649 | B2 | 3/2016 | Chiu et al. | | |
| 9,372,206 | B2 | 6/2016 | Wu et al. | | |
| 9,425,126 | B2 | 8/2016 | Kuo et al. | | |
| 9,443,783 | B2 | 9/2016 | Lin et al. | | |
| 9,461,018 | B1 | 10/2016 | Tsai et al. | | |
| 9,496,189 | B2 | 11/2016 | Yu et al. | | |
| 9,666,502 | B2 | 5/2017 | Chen et al. | | |
| 9,735,131 | B2 | 8/2017 | Su et al. | | |
| 2002/0180041 | A1* | 12/2002 | Sahara | ............... | H01L 23/3114 |
| | | | | | 257/738 |
| 2003/0222356 | A1* | 12/2003 | Kinoshita | .............. | H01L 23/50 |
| | | | | | 257/E23.079 |
| 2004/0070064 | A1* | 4/2004 | Yamane | .................. | H01L 24/24 |
| | | | | | 257/692 |
| 2005/0161829 | A1* | 7/2005 | Zeng | ....................... | H01L 24/10 |
| | | | | | 257/772 |
| 2005/0277231 | A1* | 12/2005 | Hembree | ................ | H01L 24/83 |
| | | | | | 438/126 |
| 2007/0108580 | A1* | 5/2007 | Goller | .................... | H01L 24/94 |
| | | | | | 257/E21.705 |
| 2008/0246126 | A1* | 10/2008 | Bowles | ................... | H01L 25/50 |
| | | | | | 257/659 |
| 2014/0191379 | A1* | 7/2014 | Zhang | ................... | H01L 24/95 |
| | | | | | 257/669 |
| 2014/0252600 | A1* | 9/2014 | Chang | .............. | H01L 23/737 |
| | | | | | 257/737 |
| 2014/0264817 | A1* | 9/2014 | Lee | ..................... | H01L 25/0657 |
| | | | | | 438/122 |
| 2014/0306327 | A1* | 10/2014 | Schulze | .................. | H01L 21/52 |
| | | | | | 438/106 |
| 2015/0228550 | A1* | 8/2015 | Yu | ............................ | H01L 22/20 |
| | | | | | 257/48 |
| 2015/0235936 | A1* | 8/2015 | Yu | ........................... | H01L 23/36 |
| | | | | | 257/737 |
| 2019/0051614 | A1* | 2/2019 | Dimaano Jr. | ....... | H01L 23/3128 |
| 2019/0279958 | A1* | 9/2019 | Chen | .................. | H01L 23/3114 |
| 2019/0348380 | A1* | 11/2019 | Chen | .................... | H01Q 1/2283 |
| 2021/0242100 | A1* | 8/2021 | Hou | ................. | H01L 21/76804 |

* cited by examiner

PACKAGE STRUCTURE AND METHOD FOR FORMING THE SAME

CROSS-REFERENCE TO RELATED APPLICATION

This application claims the priority benefit of U.S. Provisional application Ser. No. 63/435,325, filed on Dec. 26, 2022. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed, greater bandwidth as well as lower power consumption and latency has grown recently, there has grown a need for large-scaled and reliable electronic apparatus which utilizes advanced packaging techniques of semiconductor dies. For large-scaled electronic apparatus, the warpage issue is a problem to be solved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
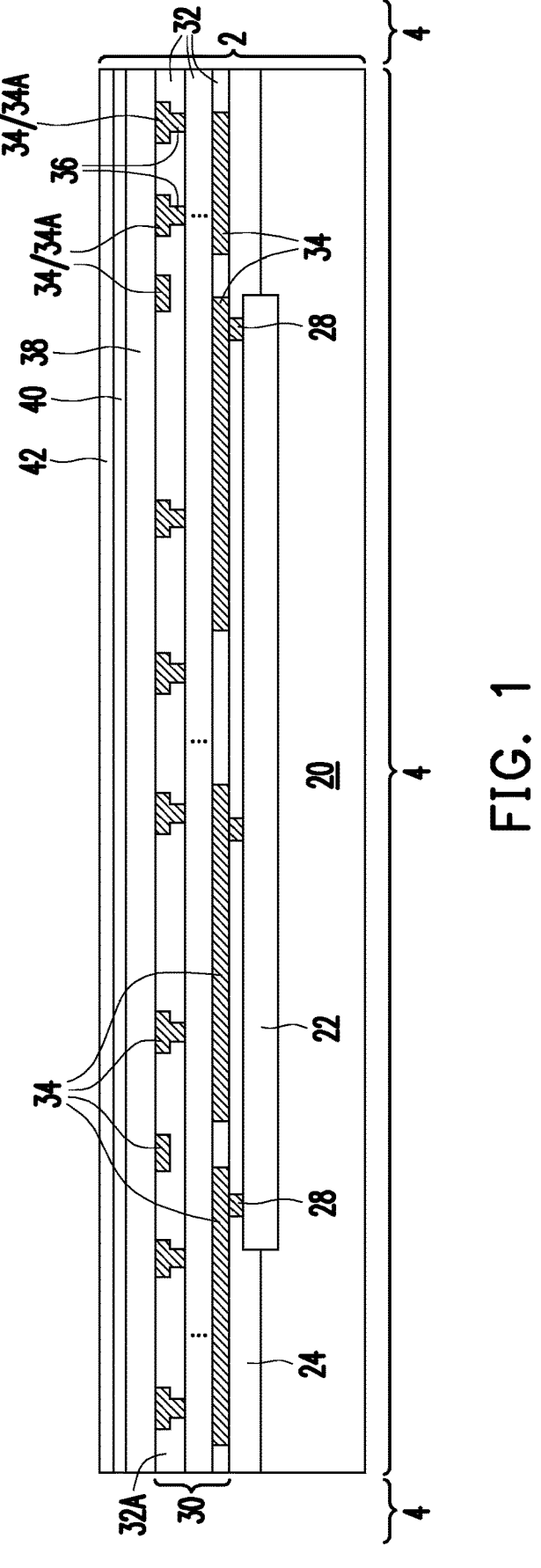
FIGS. 1 through 14 and FIG. 16 through 19 are cross-sectional views of intermediate stages in the manufacturing of a package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A System on Integrate Chip (SoIC) package and the method of fabricating the same are provided in accordance with various embodiments. The intermediate stages of forming the SoIC package are illustrated in accordance with some embodiments. Some variations of some embodiments are discussed. Throughout the various views and illustrative embodiments, like reference numbers are used to designate like elements. It is appreciated that although the formation of SoIC packages is used as examples to explain the concept of the embodiments of the present disclosure, the embodiments of the present disclosure are readily applicable to other bonding methods and structures in which metal pads and vias are bonded to each other.

FIGS. 1 through 14 and FIG. 16 through 19 are cross-sectional views of intermediate stages in the manufacturing of a package in accordance with some embodiments. FIG. 15 schematically illustrates the cross-sectional view of a package formed through face-to-back bonding in accordance with some embodiments.

FIG. 1 schematically illustrates the cross-sectional view in the formation of semiconductor wafer 2. In some embodiments, the semiconductor wafer 2 is a device wafer including active devices 22 such as transistors and/or diodes, and possibly passive devices such as capacitors, inductors, resistors, or the like. The semiconductor wafer 2 may include semiconductor dies 4 therein, with one of semiconductor dies 4 illustrated. The semiconductor dies 4 are alternatively referred to as semiconductor chip hereinafter. In some embodiments, the semiconductor die 4 is a logic die, which may be a Central Processing Unit (CPU) die, a Micro Control Unit (MCU) die, an input-output (IO) die, a base-band (BB) die, an application processor (AP) die, or the like. The semiconductor die 4 may also be a memory die such as a Dynamic Random Access Memory (DRAM) die or a Static Random Access Memory (SRAM) die.

In some alternative embodiments, the semiconductor wafer 2 includes passive devices (with no active devices).

The embodiments of the present disclosure may also be applied to other types of package components such as interposer wafers.

In some embodiments, the semiconductor wafer 2 includes a semiconductor substrate 20 and the conductive features formed at a top surface of the semiconductor substrate 20. The semiconductor substrate 20 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. The semiconductor substrate 20 may also be a bulk silicon substrate or a Silicon-On-Insulator (SOI) substrate. Shallow Trench Isolation (STI) regions (not shown) may be formed in the semiconductor substrate 20 to isolate the active regions in the semiconductor substrate 20. Although not shown, through-silicon-vias (TSVs) may be formed to extend into semiconductor substrate 20, and the through-silicon-vias (TSVs) are used to electrically inter-couple the conductive features on opposite sides of the semiconductor wafer 2.

In some embodiments, the semiconductor wafer 2 includes integrated circuit devices 22, which are formed on the top surface of the semiconductor substrate 20. Exemplary integrated circuit devices 22 may include Complementary Metal-Oxide Semiconductor (CMOS) transistors, resistors, capacitors, diodes, and/or the like. The details of integrated circuit devices 22 are not illustrated herein. In some alternative embodiments, the semiconductor wafer 2 is used for forming interposers, in which the semiconductor substrate 20 includes a semiconductor substrate or a dielectric substrate.

An inter-layer dielectric (ILD) layer 24 is formed over the semiconductor substrate 20, and fills the space between the gate stacks of transistors (not shown) in the integrated circuit devices 22. In some embodiments, the ILD layer 24 is formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS), or the like. The ILD layer 24 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

Contact plugs 28 are formed in the ILD layer 24, and are used to electrically connect the integrated circuit devices 22 to overlying metal lines 34 and vias 36. In some embodiments, the contact plugs 28 are formed of a conductive material selected from tungsten, aluminum, copper, titanium, tantalum, titanium nitride, tantalum nitride, alloys therefore, and/or multi-layers thereof. The formation of the contact plugs 28 may include forming contact openings in the ILD layer 24, filling a conductive material(s) into the contact openings, and performing a planarization (such as Chemical Mechanical Polish (CMP) process) to level the top surfaces of the contact plugs 28 with the top surface of the ILD layer 24.

Over the ILD layer 24 and the contact plugs 28 resides an interconnect structure 30. The interconnect structure 30 includes dielectric layers 32 as well as metal lines 34 and vias 36 formed in the dielectric layers 32. The dielectric layers 32 are alternatively referred to as inter-metal dielectric (IMD) layers 32 hereinafter. In some embodiments, at least the lower ones of the dielectric layers 32 are formed of a low-k dielectric material having a dielectric constant (k-value) lower than about 3.0 or about 2.5. The dielectric layers 32 may be formed of Black Diamond (a registered trademark of Applied Materials), a carbon-containing low-k dielectric material, Hydrogen SilsesQuioxane (HSQ), MethylSilsesQuioxane (MSQ), or the like. In some embodiments, some or all of the dielectric layers 32 are formed of non-low-k dielectric materials such as silicon oxide, silicon carbide (SiC), silicon carbo-nitride (SiCN), silicon oxy-carbo-nitride (SiOCN), or the like. In some embodiments, the formation of the dielectric layers 32 includes depositing a porogen-containing dielectric material, and then performing a curing process to drive out the porogen, and hence the remaining the dielectric layers 32 becomes porous. Etch stop layers (not shown), which may be formed of silicon carbide, silicon nitride, or the like, are formed between the IMD layers 32, and are not shown for simplicity.

The metal lines 34 and the vias 36 are formed in the dielectric layers 32. The metal lines 34 at a same level are collectively referred to as a metal layer hereinafter. In some embodiments, the interconnect structure 30 includes a plurality of metal layers that are interconnected through vias 36. The metal lines 34 and the vias 36 may be formed of copper or copper alloys, and they can also be formed of other metals. The formation process may include single damascene and dual damascene processes. In a single damascene process, a trench is first formed in one of the dielectric layers 32, followed by filling the trench with a conductive material. A planarization process such as a CMP process is then performed to remove the excess portions of the conductive material higher than the top surface of the IMD layers, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier and a copper-containing metallic material over the diffusion barrier. The diffusion barrier may include titanium, titanium nitride, tantalum, tantalum nitride, or the like.

The metal lines 34 include metal lines 34A, which are sometimes referred to as top metal lines. The top metal lines 34A are also collectively referred to as being a top metal layer. The respective dielectric layer 32A may be formed of a non-low-k dielectric material such as Un-doped Silicate Glass (USG), silicon oxide, silicon nitride, or the like. The dielectric layer 32A may also be formed of a low-k dielectric material, which may be selected from the similar materials of the underlying the IMD layers 32.

In some embodiments of the present disclosure, the dielectric layers 38, 40, and 42 are formed over the top metal layer. The dielectric layers 38 and 42 may be formed of silicon oxide, silicon oxynitride, silicon oxy-carbide, or the like, the dielectric layer 40 is formed of a dielectric material different from the dielectric material of the dielectric layer 42. For example, the dielectric layer 42 may be formed of silicon nitride, silicon carbide, or the like.

Figure 2:
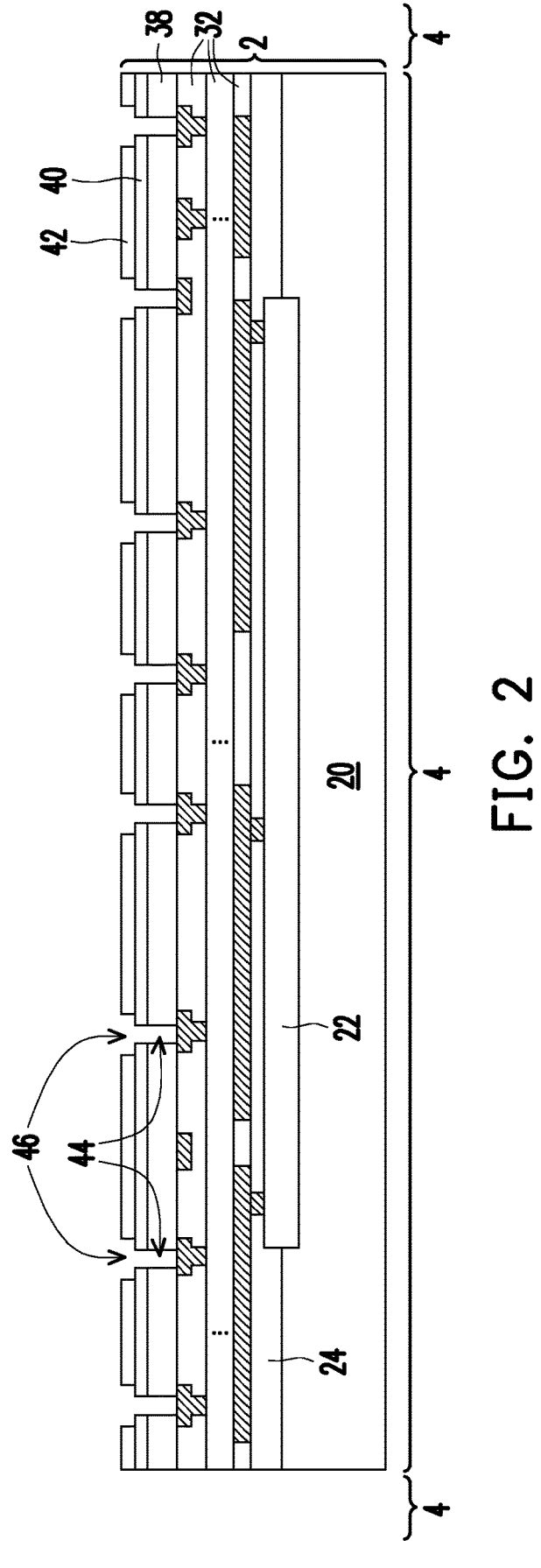

Referring to FIG. 2, via openings 44 and trenches 46 are formed. To form the via openings 44 and the trenches 46, photoresists (not shown) and/or hard masks (not shown) may be formed and patterned over the dielectric layer 42 to aid the formation of the via openings 44 and the trenches 46. In some embodiments, an anisotropic etch is performed to form the trenches 46, and the etch stops on the dielectric layer 40 serving as an etch stop layer. Another anisotropic etch is then performed to form the via openings 44 by etching the exposed etch stop layer 40 and the underlying portions of the dielectric layer 38. In some embodiments, the etch stop layer 40 is not formed, and the via openings 44 and the trenches 46 are formed in a single dielectric layer. The etching may be performed using time mode to allow the etching (for forming the trenches 46) to stop at an intermediate level between a top surface and a bottom surface of the single dielectric layer.

Figure 3:
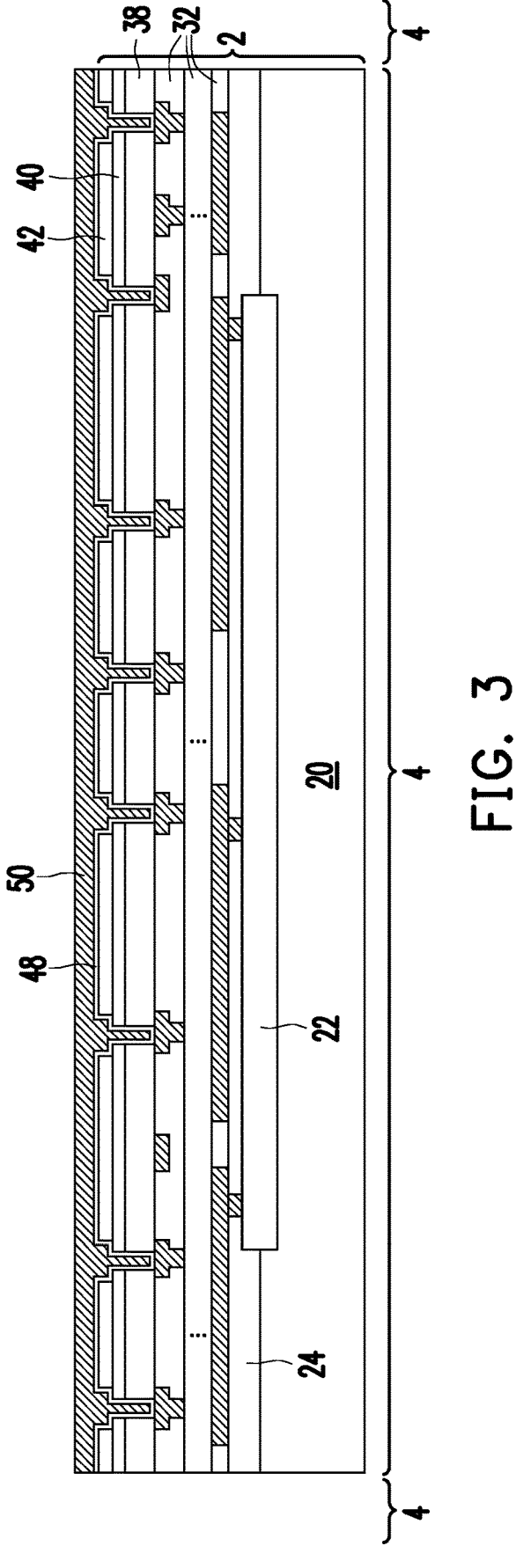

FIG. 3 illustrates the filling of conductive materials. A conductive diffusion barrier 48 is first formed. In some embodiments, the diffusion barrier 48 is formed of titanium, titanium nitride, tantalum, tantalum nitride, or the like. The diffusion barrier 48 may be formed, for example, using Atomic Layer Deposition (ALD), Physical Vapor Deposition (PVD), or the like. The diffusion barrier 48 includes first portions distributed over the surface of the dielectric layer 42, and the diffusion barrier 48 further includes second portions distributed on the bottoms and sidewalls of the trenches 46 and the via openings 44.

Next, a metallic material 50 is deposited, for example, through Electro-Chemical Plating (ECP). The metallic material 50 fills the remaining portions of the trenches 46 and the via openings 44. The metallic material 50 further includes some portions over the top surface of the dielectric layer 42. The metallic material 50 may include copper or copper alloy, or another metallic material that can diffuse in a subsequent anneal process, so that metal-to-metal direct bond may be formed.

Figure 4:
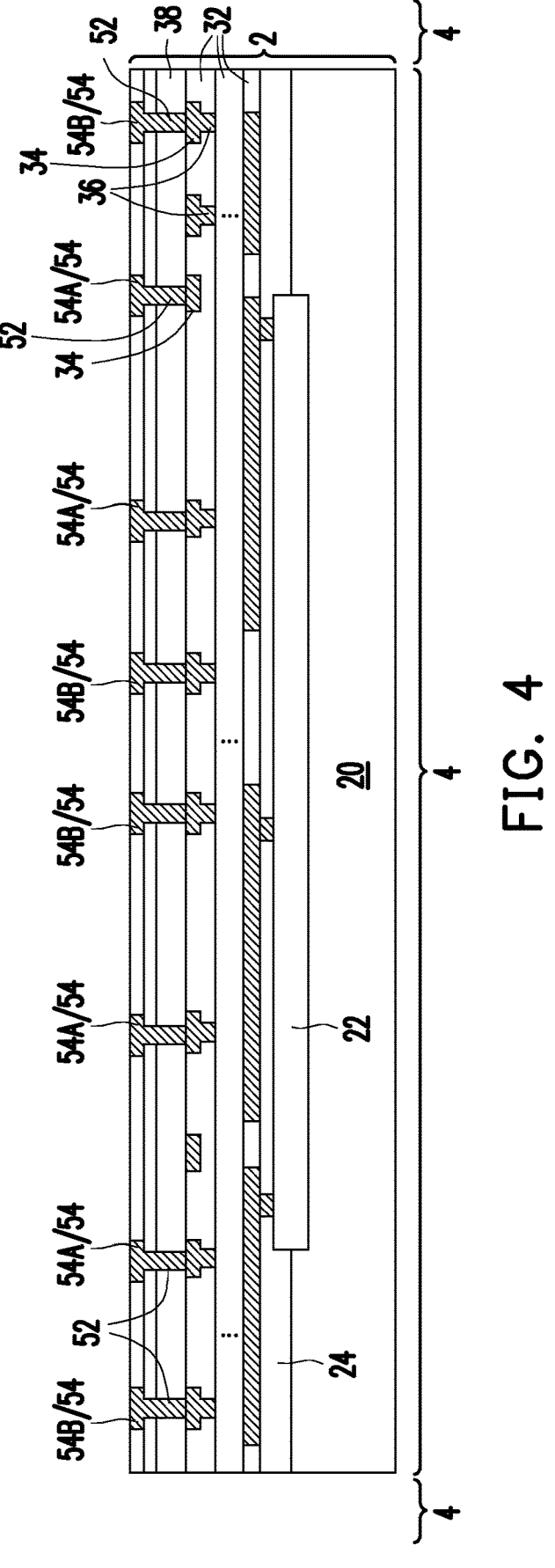

Next, as shown in FIG. 4, a planarization process such as a Chemical Mechanical Polish (CMP) process is performed to remove excess portions of the metallic material 50 and the diffusion barrier 48, until the dielectric layer 42 is exposed. The remaining portions of the diffusion barrier 48 and the metallic material 50 include the vias 52 and the metal pads 54 (including 54A and 54B). FIG. 4 schematically illustrates the metal pads for bonding. It is appreciated that the metal lines may also be formed simultaneously as the metal pads 54. The metal pads 54 includes metal pads 54A, which are used for bonding to semiconductor dies, and metal pads 54B, which are used for through-silicon-vias to land.

The semiconductor die 4 may also include metal pads such as aluminum or aluminum copper pads, which may be formed in dielectric layer 38 (shown in FIG. 4) in accordance with some embodiments. The aluminum pads are not shown for simplicity.

Figure 5:
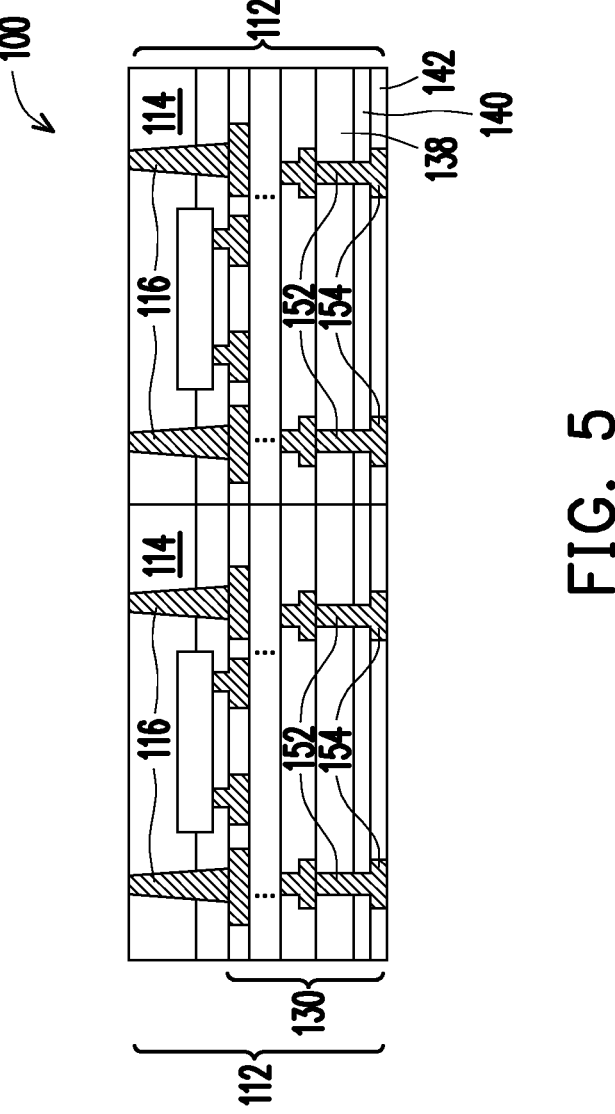

FIG. 5 schematically illustrates the formation of a semiconductor wafer 100, which includes semiconductor dies 112 therein. In some embodiments, the semiconductor dies 112 are logic dies, which may be CPU dies, MCU dies, IO dies, Base-Band dies, or AP dies. The semiconductor dies 112 may also be memory dies. The semiconductor wafer 100 includes semiconductor substrate 114, which may be a silicon substrate. Through-Silicon Vias (TSVs) 116, sometimes referred to as through-semiconductor vias or through-vias, are formed to penetrate through semiconductor substrate 114. The TSVs 116 are used to connect the devices and metal lines formed on the front side (the illustrated bottom side) of the semiconductor substrate 114 to the backside of the semiconductor substrate 114. Also, the semiconductor dies 112 include interconnect structures 130 for connecting to the active devices and passive devices in the semiconductor dies 112. The interconnect structures 130 include metal lines and vias (not shown).

The semiconductor die 112 may include dielectric layers 138 and 142, and an etch stop layer 140 between the dielectric layers 138 and 142. Bond pads 154 and vias 152 are formed in the dielectric layers 138, the etch stop layer 140, and the dielectric layer 142. In some embodiments, all the semiconductor dies 112 are free from organic dielectric materials such as polymers. The materials and the formation methods of the dielectric layers 138 and 142, the bond pads

154, and the vias 152 may be similar to their corresponding parts in the semiconductor die 4, and hence the details are not repeated herein.

Figure 6:
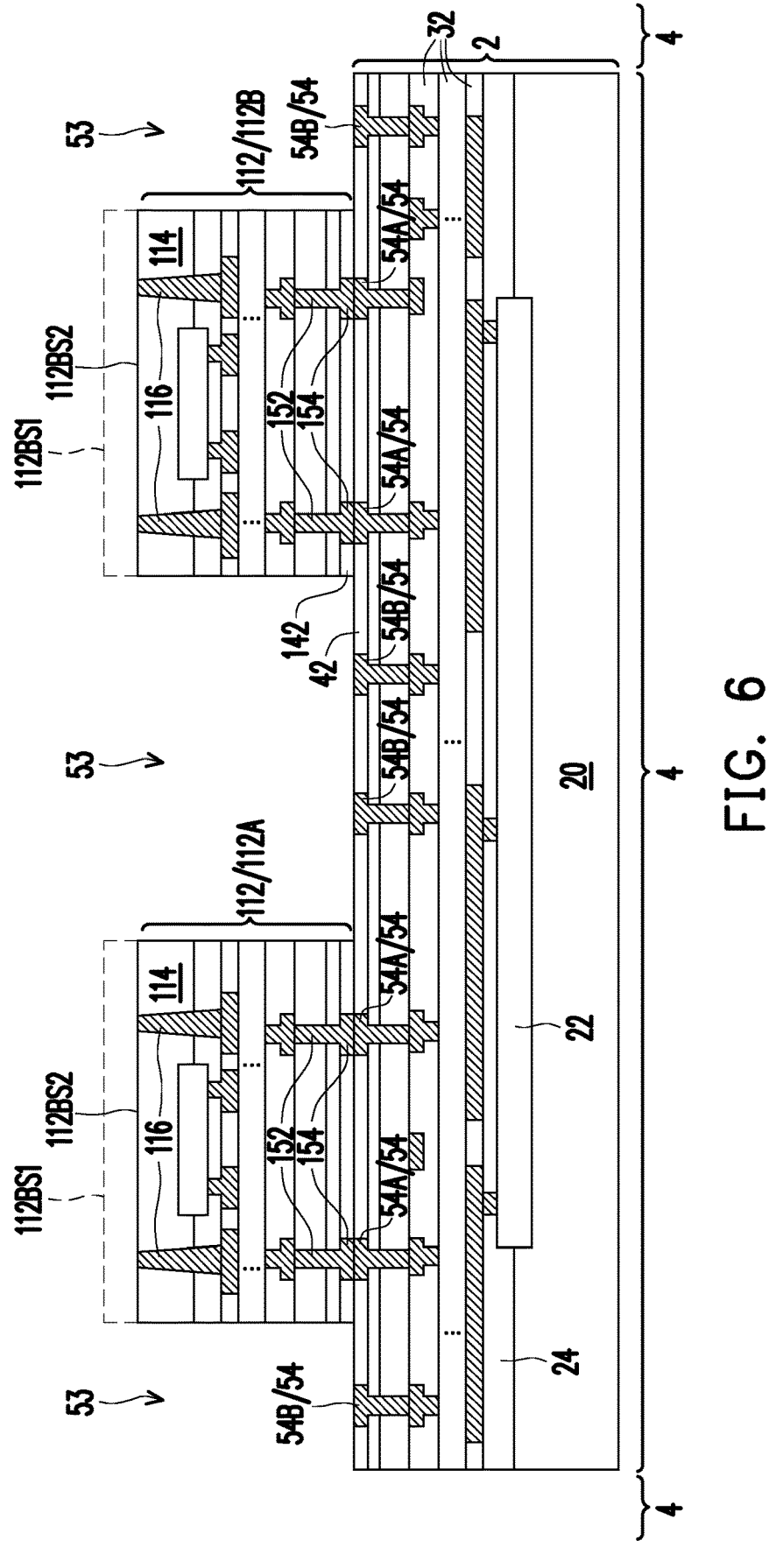

Referring to FIG. 5, the semiconductor wafer 100 is singulated into a plurality of singulated semiconductor dies 112. FIG. 6 schematically illustrates the bonding of the semiconductor dies 112 (including 112A and 112B) to the semiconductor die 4. Each of the semiconductor dies 112A and 112B may be formed as having the structure (and using the similar formation method as discussed) as FIG. 5.

The semiconductor dies 112A and 112B may be identical to each other or may be different from each other. For example, the semiconductor dies 112A and 112B may be different types of dies selected from the above-listed types. Furthermore, the semiconductor dies 112 may be formed using different technologies such as 45 nm technology, 28 nm technology, 20 nm technology, or the like. Also, one of the semiconductor dies 112 may be a digital circuit die, while the other one of the semiconductor dies 112 may be an analog circuit die. The semiconductor dies 4, 112A, and 112B in combination function as a system. Splitting the functions and circuits of a system into different semiconductor dies such as the semiconductor dies 4, 112A, and 112B may optimize the formation of these dies, and may result in the reduction of manufacturing cost.

Referring to FIG. 6, a chip-to-wafer bonding process is performed to bond the semiconductor dies 112A and 112B with the semiconductor wafer 2. The bonding of the semiconductor dies 112A and 112B to the semiconductor die 4 may be achieved through a bonding including metal-to-metal bonding and dielectric-to-dielectric bonding. For example, the bond pads 154 are bonded to the bond pads 54A through metal-to-metal direct bonding. In some embodiments, the metal-to-metal direct bonding is copper-to-copper direct bonding. The bond pads 154 may have sizes greater than, equal to, or smaller than, the sizes of the respective the bond pads 54A. Furthermore, the dielectric layers 142 are bonded to surface dielectric layer 42 through dielectric-to-dielectric bonding, which may be fusion bonding, for example, with Si—O—Si bonds generated. Gaps 53 are left between neighboring semiconductor dies 112A and 112B.

To achieve the bonding between the semiconductor dies 112 and the semiconductor wafer 2, the semiconductor dies 112 are first pre-bonded to the dielectric layer 42 and bond pads 54A by pressing the semiconductor dies 112 against the semiconductor wafer 2. After all semiconductor dies are pre-bonded, an annealing process is performed to cause the inter-diffusion of the metals in the bond pads 54A and the corresponding overlying the bond pads 154. The annealing temperature may be higher than about 350° C., and may be in the range between about 350° and about 550° C. in accordance with some embodiments. The annealing time may be in the range between about 1.5 hours and about 3.0 hours, and may be in the range between about 1.0 hour and about 2.5 hours in accordance with some embodiments.

As illustrated in FIG. 6, in some embodiments, after the bonding process, a backside grinding process may be performed to thin the semiconductor dies 112, for example, to a thickness between about 15 μm and about 30 μm. FIG. 6 schematically illustrates dashed lines 112-BS1, which are the back surfaces of semiconductor dies 112 before the backside grinding process. The solid lines 112-BS2 are the back surfaces of device dies 112 after the backside grinding process. Through the thinning process of the semiconductor dies 112, the aspect ratio of the gaps 53 is reduced in order to perform the subsequently performed gap filling process.

Otherwise, the gap filling process may be difficult due to the otherwise high aspect ratio of the gaps 53. After the backside grinding process, the TSVs 116 of the semiconductor die 112 may be revealed. Alternatively, the TSVs 116 are not revealed at this time, and the backside grinding is stopped when there is a thin layer of substrate covering the TSVs 116, and the TSVs 116 may be revealed in the step shown in FIG. 8. In some other embodiments in which the aspect ratio of gaps 53 is not too high, the backside grinding is omitted.

Figure 7:
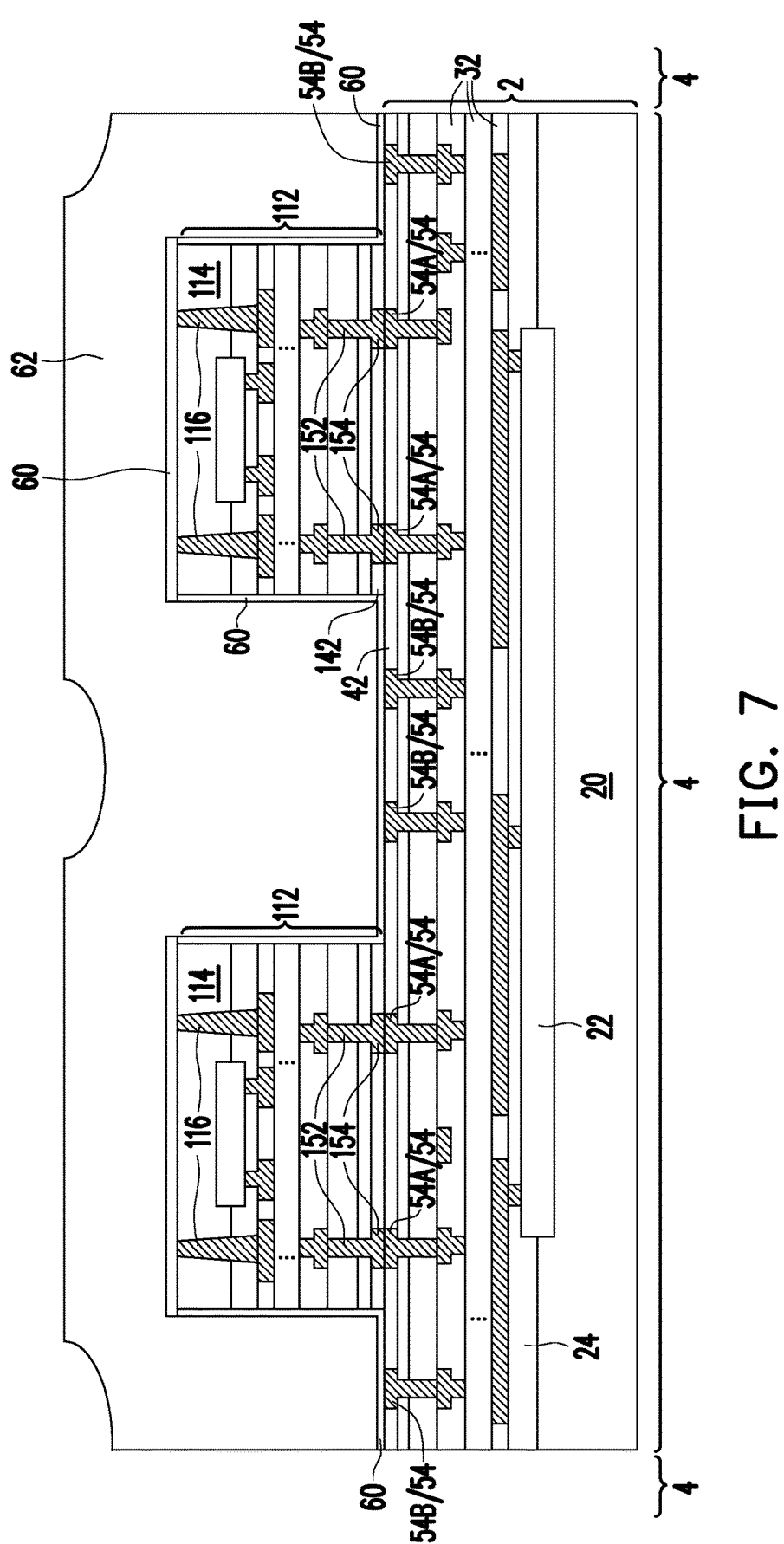

FIG. 7 schematically illustrates the formation of gap filling layers or gap filling material, which includes a dielectric layer 62 and an underlying etch stop layer 60. The etch stop layer 60 is formed of a dielectric material that has a good adhesion to the sidewalls of the semiconductor dies 112 and the top surfaces of the dielectric layer 42 and the bond pads 54B. In some embodiments, the etch stop layer 60 is formed of a nitride-containing material such as silicon nitride. The etch stop layer 60 may be a conformal layer, for example, with the thickness T1A of horizontal portions and the thickness T1B of the vertical portions being substantially equal, for example, with the difference (T1A-T1B) having an absolute value smaller than about 20 percent, or smaller than about 10 percent, of both thicknesses T1A and T1B. The deposition may include a conformal deposition method such as Atomic Layer Deposition (ALD) or Chemical Vapor Deposition (CVD).

The dielectric layer 62 is formed of a material different from the material of the etch stop layer 60. In some embodiments, the dielectric layer 62 is formed of silicon oxide, which may be formed of TEOS, while other dielectric materials such as silicon carbide, silicon oxynitride, silicon oxy-carbo-nitride, PSG, BSG, BPSG, or the like may also be used. The dielectric layer 62 may be formed using CVD, High-Density Plasma Chemical Vapor Deposition (HDPCVD), flowable CVD, spin-on coating, or the like. The dielectric layer 62 may fully fill the remaining gaps 53, as illustrated in FIG. 6.

Figure 8:
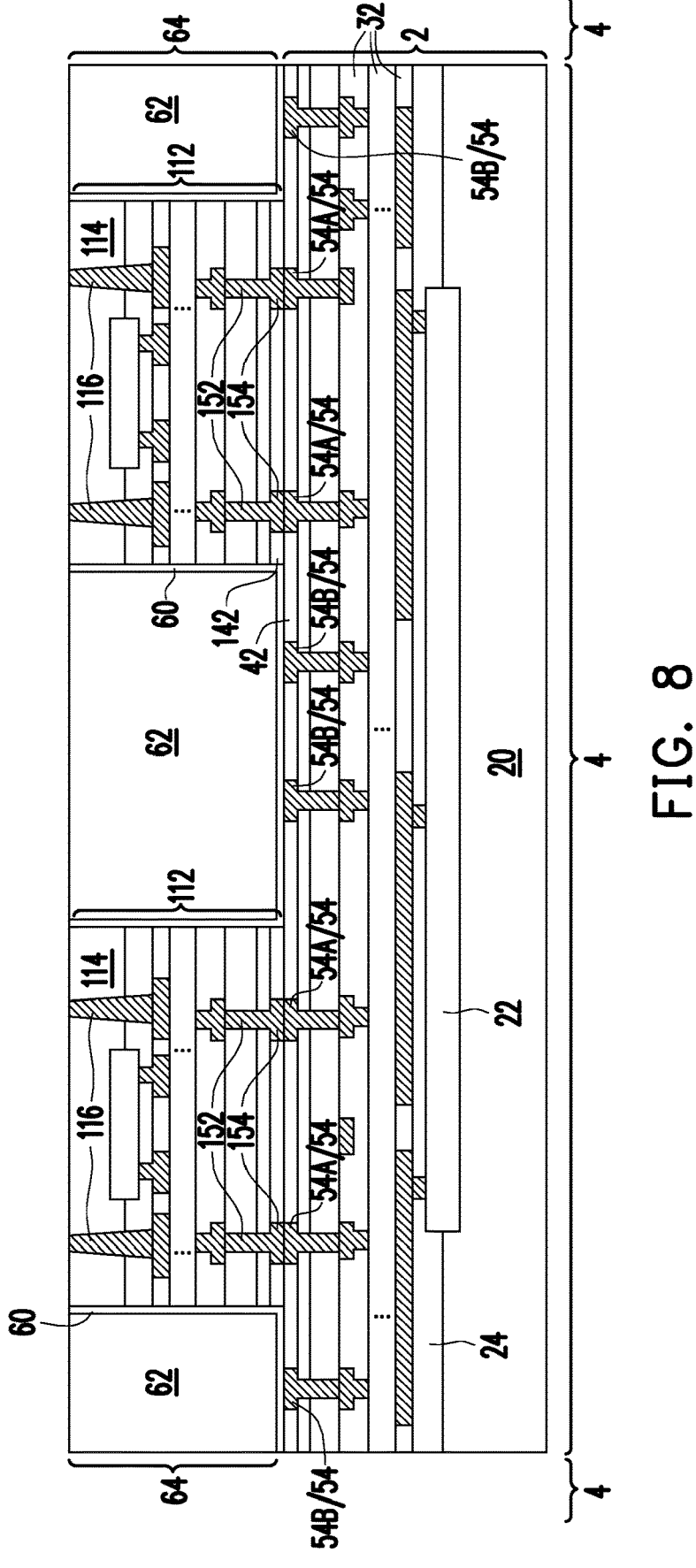

Referring to FIG. 8, a planarization process such as a CMP process or a mechanical grinding process is performed to remove excess portions of the etch stop layer 60 and the dielectric layer 62, so that the semiconductor dies 112 are exposed. Also, the TSV 116 are exposed. The remaining portions of the etch stop layer 60 and the dielectric layer 62 are collectively referred to as (gap-filling) isolation regions 64.

Figure 9:
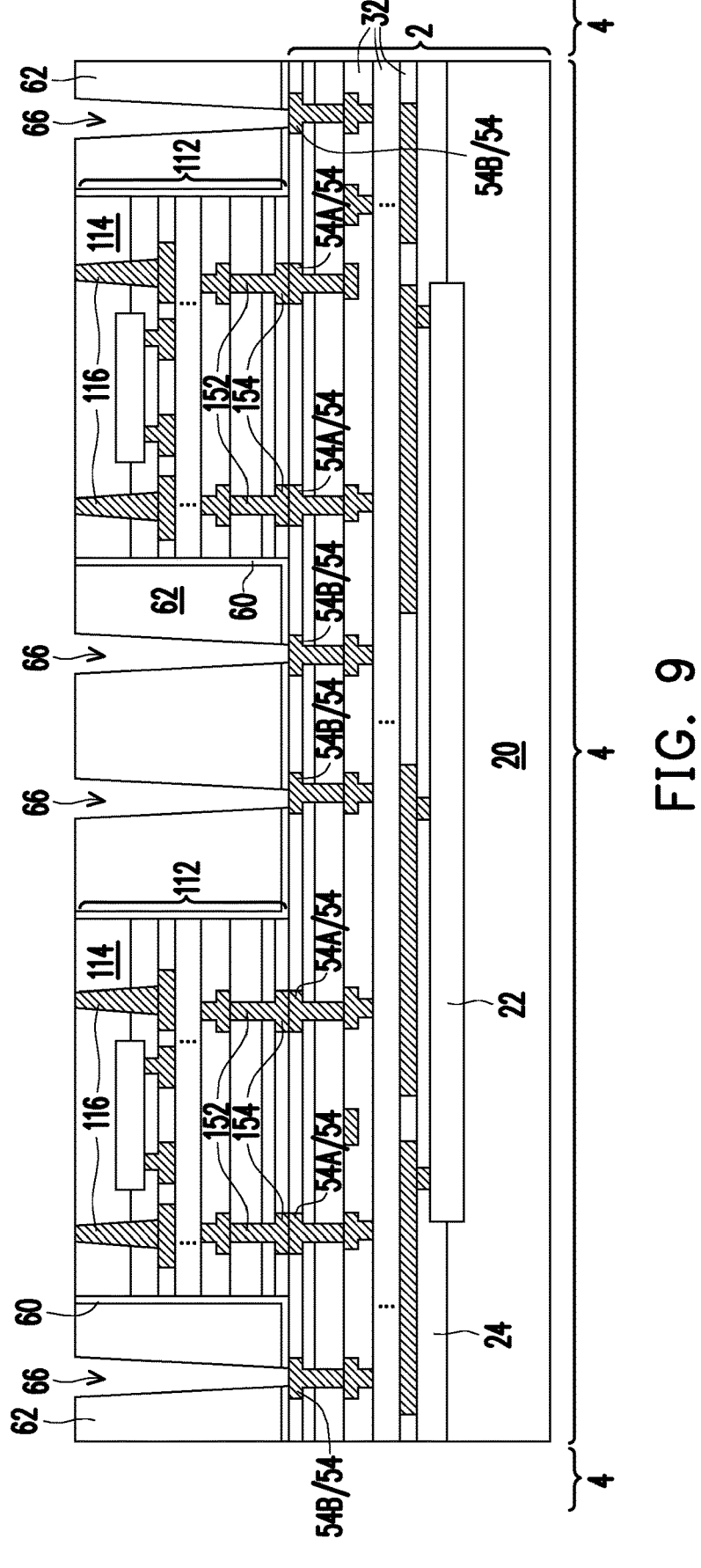

FIG. 9 schematically illustrates the etching of the etch stop layer 60 and the dielectric layer 62 to form openings 66. In some embodiments, a photoresist (not shown) is formed and patterned, and the dielectric layer 62 and the etch stop layer 60 are etched using the patterned photoresist as an etching mask. The openings 66 are thus formed, and extend down to the etch stop layer 60. In some embodiments, the dielectric layer 62 includes an oxide, and the etching may be performed through dry etching. The etching gas may include a mixture of $NF_3$ and $NH_3$, or a mixture of HF and $NH_3$. Next, the etch stop layer 60 is etched, so that the openings 66 extend down to the bond pads 54B. In some embodiments, the etch stop layer 60 is formed of silicon nitride, and the etching is performed using dry etching. The etching gas may include a mixture of $CF_4$, $O_2$, and $N_2$, a mixture of $NF_3$ and $O_2$, $SF_6$, or a mixture of $SF_6$ and $O_2$.

Figure 10:
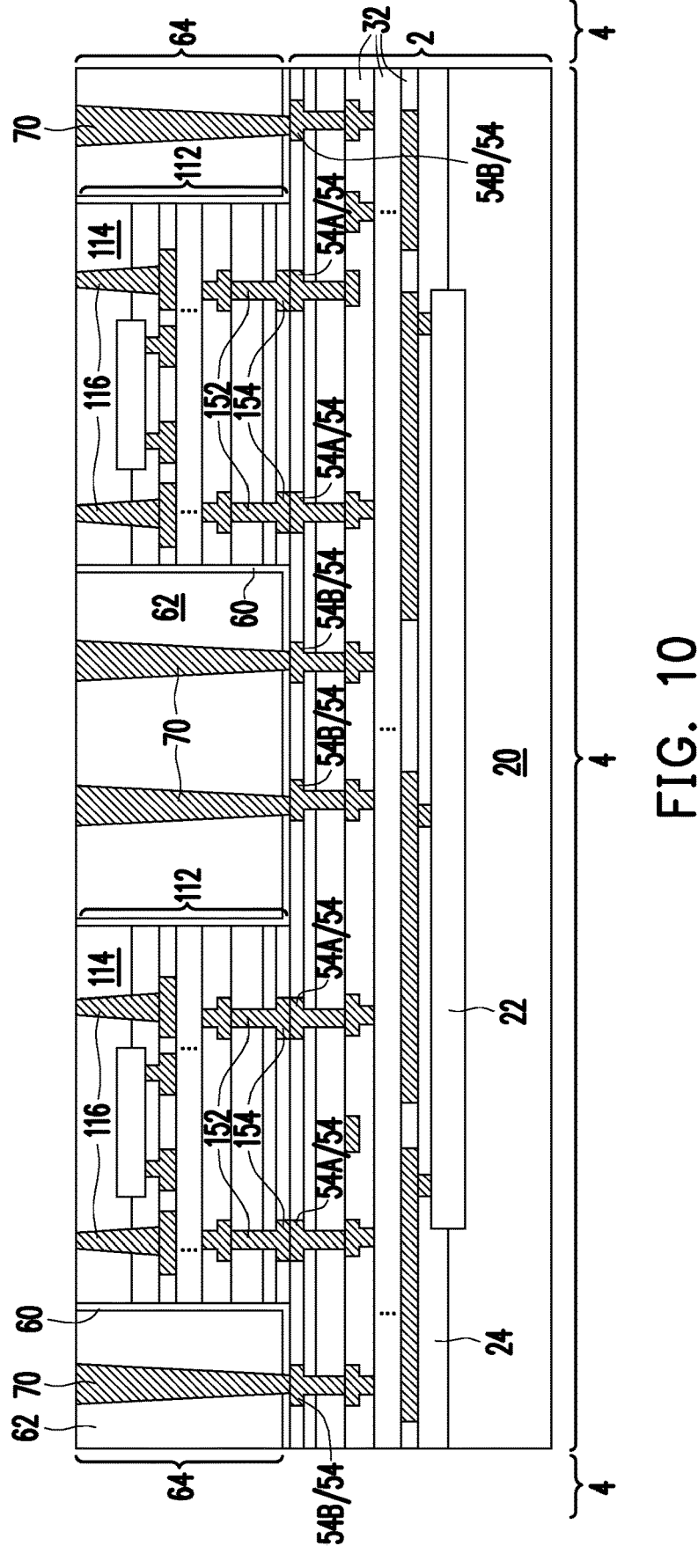

FIG. 10 schematically illustrates the formation of through-vias 70, which fills the openings 66 shown in FIG. 9, wherein the through-vias 70 are electrically connected to the bond pads 54B. In some embodiments, the formation of the through-vias 70 includes performing a plating process such as an electrical-chemical plating process or an electroless plating process. The through-vias 70 may include a metallic material such as tungsten, aluminum, copper, or the like. A conductive barrier layer (such as titanium, titanium nitride, tantalum, tantalum nitride, or the like) may also be formed underlying the metallic material. A planarization such as a CMP is performed to remove excess portions of the plated metallic material, and the remaining portions of the metallic material form the through-vias 70. The through-vias 70 may have substantially straight and vertical sidewalls. Also, the through-vias 70 may have a tapered profile, with top widths slightly greater than the respective bottom widths.

In some alternative embodiments, the TSVs 116 are not pre-formed in the semiconductor dies 112. Rather, the TSVs 166 may be formed after the formation of the isolation regions 64. For example, either before or after the formation of the openings 66 shown in FIG. 8, the semiconductor dies 112 are etched to form additional openings (occupied by the illustrated TSVs 116). The additional openings in the semiconductor dies 112 and the openings 66 may be filled simultaneously to form the TSVs 116 and the through-vias 70. The resulting TSVs 116 and the through-vias 70 may have upper portions wider than the respective lower portions, which is different from what is shown in FIG. 10.

Figure 11:
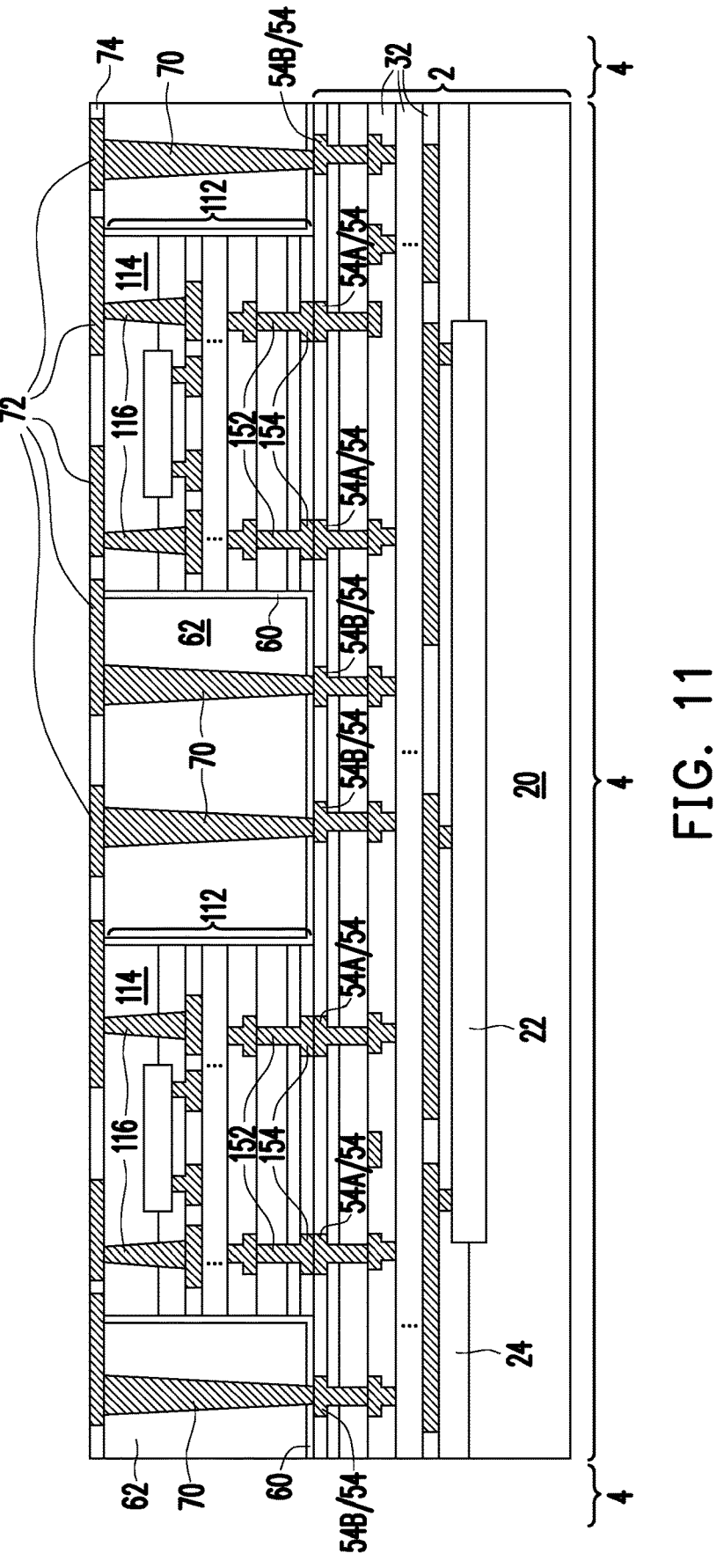

Referring to FIG. 11, redistribution lines (RDLs) 72 and a dielectric layer 74 are formed. In some embodiments, the dielectric layer 74 is formed of an oxide such as silicon oxide, a nitride such as silicon nitride, or the like. The RDLs 72 may be formed using a damascene process, which includes etching dielectric layer 74 to form openings, depositing a conductive barrier layer into the openings, plating a metallic material such as copper or a copper alloy, and performing a planarization to remove the excess portions of the metallic material.

Figure 12:
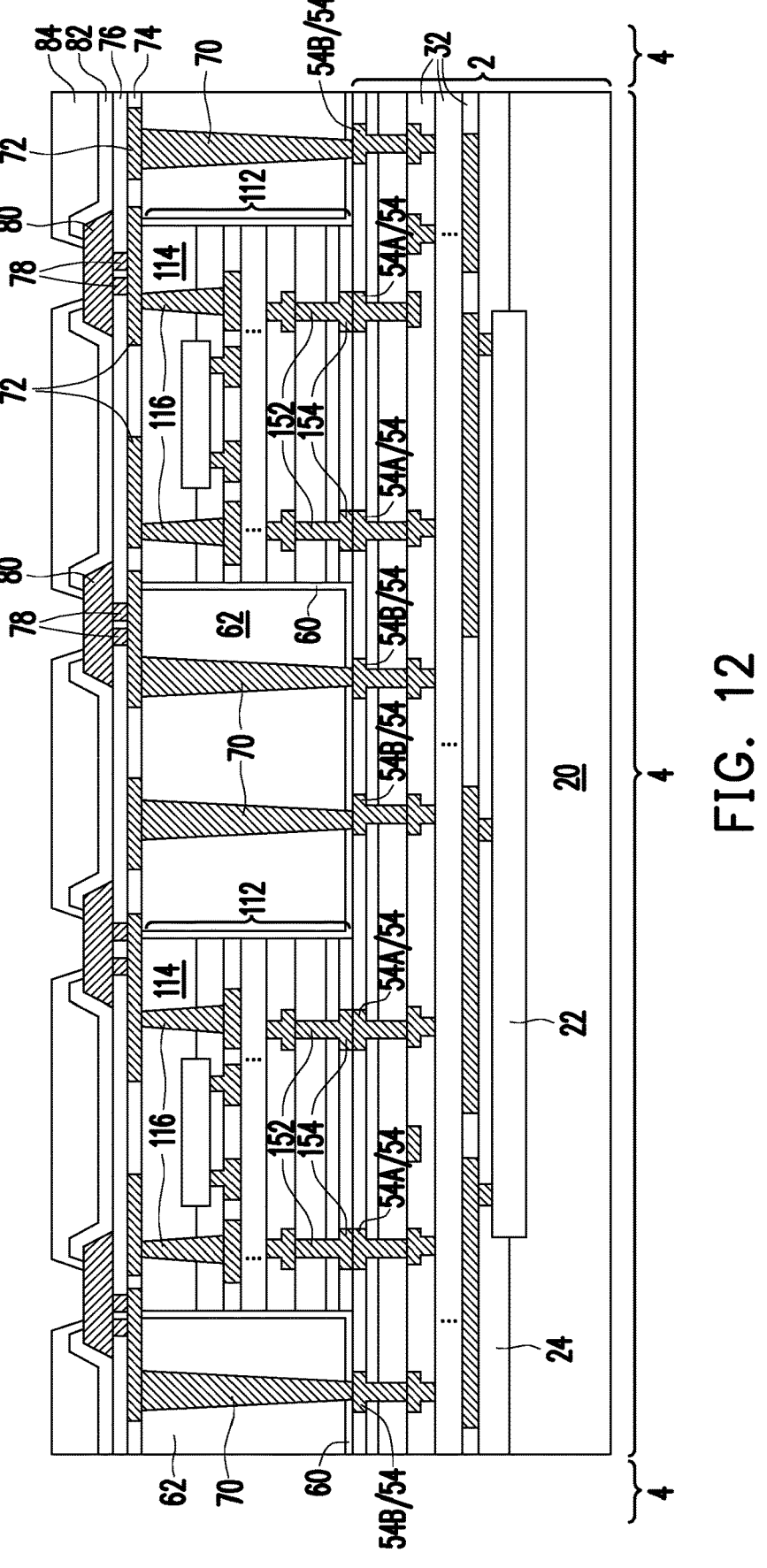

FIG. 12 illustrates the formation of passivation layers, metal pads, and overlying dielectric layers. Referring to FIG. 12, a passivation layer 76 (sometimes referred to as passivation-1) is formed over the dielectric layer 74, and the vias 78 are formed in the passivation layer 76 to electrically connect to the RDLs 72. Metal pads 80 are formed over the passivation layer 76, and are electrically coupled to the RDLs 72 through the vias 78. The metal pads 80 may be aluminum pads or aluminum-copper pads, and other metallic materials may be used.

As also shown in FIG. 12, a passivation layer 82 (sometimes referred to as passivation-2) is formed over the passivation layer 76. Each of the passivation layers 76 and 82 may be a single layer or a composite layer, and may be formed of a non-porous material. In some embodiments, each of the passivation layers 76 and 82 is a composite layer including a silicon oxide layer (not shown separately), and a silicon nitride layer (not shown separately) over the silicon oxide layer. The passivation layers 76 and 82 may also be formed of other non-porous dielectric materials such as Un-doped Silicate Glass (USG), silicon oxynitride, and/or the like.

Next, the passivation layer 82 is patterned, so that some portions of the passivation layer 82 cover the edge portions of the metal pads 80, and some portions of the metal pads 80 are exposed through the openings in the passivation layer 82. A polymer layer 84 is then formed, and then patterned to expose the metal pads 80. The polymer layer 84 may be formed of polyimide, polybenzoxazole (PBO), or the like. In some embodiments, the structure underlying the metal pads 80 is free from organic materials (such as polymer layers), so that the process for forming the structures underlying the metal pads 80 may adopt the process used for forming semiconductor dies, and fine-pitches RDLs (such as the RDLs 72) having small pitches and line widths are made possible.

Figure 13:
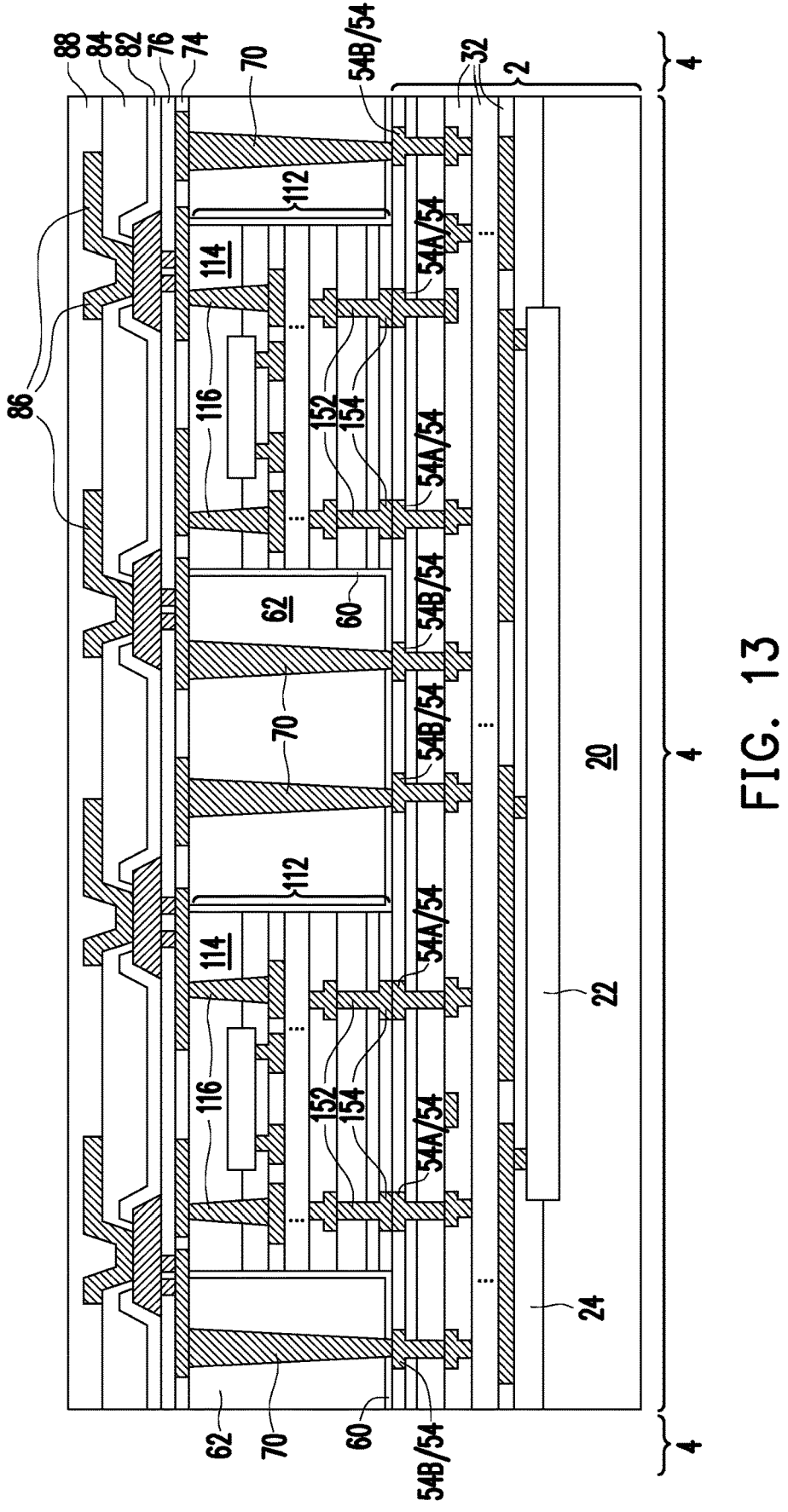

Referring to FIG. 13, post-passivation interconnects (PPIs) 86 are formed, which may include forming a metal seed layer and a patterned mask layer (not shown) over the metal seed layer, and plating PPIs 86 in the patterned mask layer. The patterned mask layer and the portions of the metal seed layer overlapped by the patterned mask layer are then removed in etching processes. A polymer layer 88 is then formed, which may be formed of PBO, polyimide, or the like. The polymer layer 88 is formed on the polymer layer 84 to covers the PPIs 86.

Figure 14:
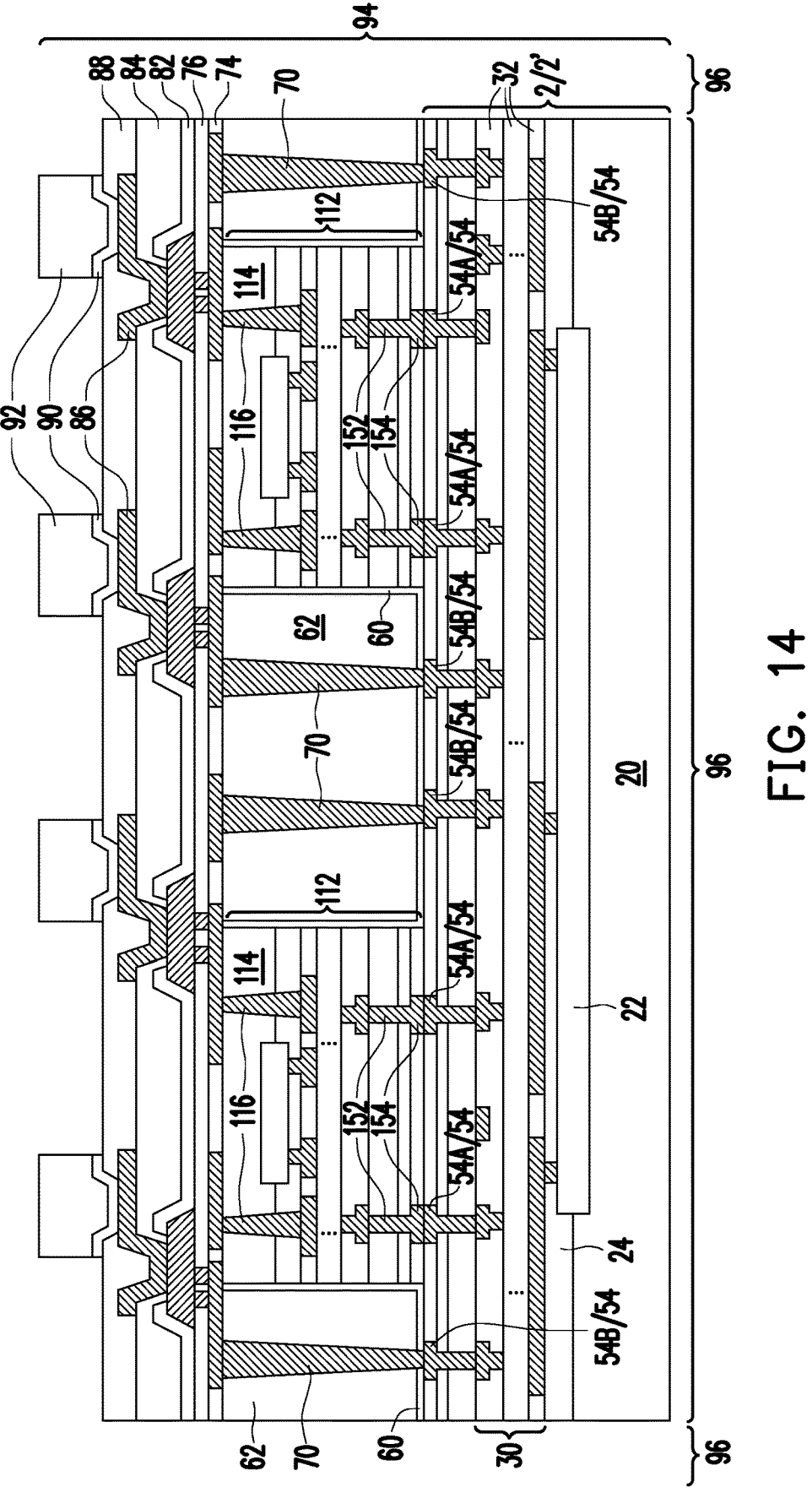
Figure 15:
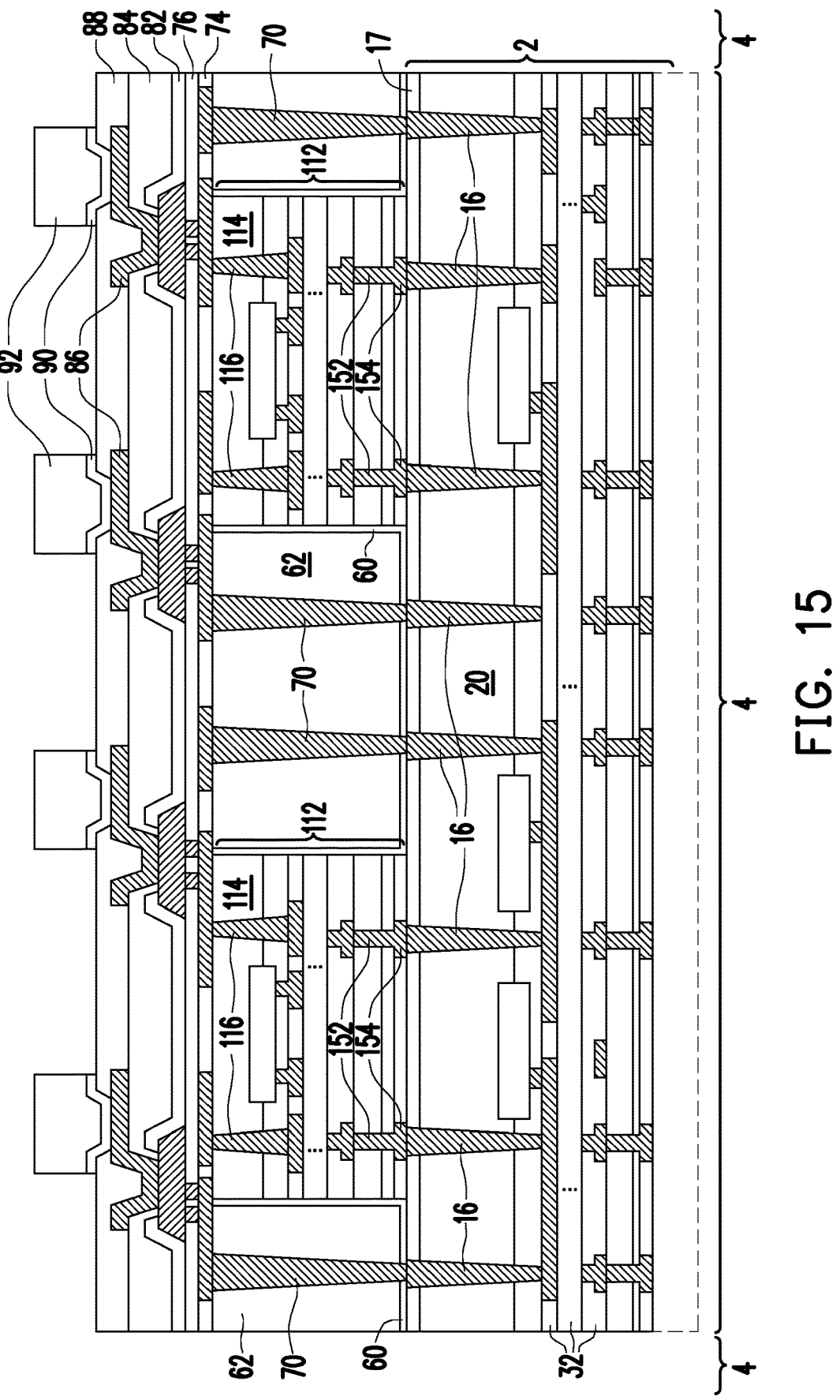
FIG. 15 schematically illustrates the cross-sectional view of a package formed through face-to-back bonding in accordance with some embodiments.

Referring to FIG. 14, the polymer layer 88 is patterned to form openings for revealing the PPIs 86. Then, under-bump metallurgies (UBMs) 90 are formed, and the UBMs 90 extend into the polymer layer 88 to connect to the PPIs 86 through the openings defined in the polymer layer 88. In some embodiments, each of the UBMs 90 includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in the UBMs 90.

As shown in FIG. 14, conductive posts 92 are formed on the UBMs 90. In some embodiments, the coplanarity of the conductive posts 92 range from about 20 micrometers to about 30 micrometers. A formation process for forming the UBMs 90 and the conductive posts 92 includes depositing a blanket UBM layer, forming and patterning a mask (which may be a photoresist, not shown), with portions of the blanket UBM layer being exposed through the opening in the mask. After the formation of the UBMs 90, the illustrated package is placed into a plating solution (not shown), and a plating step is performed to form the conductive posts 92 on the UBMs 90. In some embodiments, the conductive posts 92 include non-solder parts (not shown), which are not molten in the subsequent reflow processes. The non-solder parts may be formed of copper, and hence are referred to as copper bumps hereinafter, although they may be formed of other non-solder materials. Each of the conductive posts 92 may also include cap layer(s) (not shown) selected from a nickel layer, a nickel alloy, a palladium layer, a gold layer, a silver layer, or multi-layers thereof. The cap layer(s) are formed over the copper bumps. The conductive posts 92 may further include solder caps, which may be formed of a Sn—Ag alloy, a Sn—Cu alloy, a Sn—Ag—Cu alloy, or the like, and may be lead-free or lead-containing. The structure formed in preceding steps is referred to as re-constructed wafer 94. A die-saw (singulation) step is performed on the re-constructed wafer 94 to singulate the re-constructed wafer 94 into singulated package structures 96.

The package structure 96 shown in FIG. 14 is a face-to-face SoIC structure, in which the semiconductor dies 112 have their active surfaces or front surfaces facing the active surface or front surface of the semiconductor die 4. The package structure 96 may include a semiconductor die 2', at least one semiconductor die 112 and conductive posts 92. The at least one semiconductor die 112 is stacked on and electrically connected to the semiconductor die 2'. The conductive posts 92 are disposed on and electrically connected to the semiconductor die 112. The at least one semiconductor die 112 is spaced apart from the conductive posts 92 by the semiconductor die 2'. In some embodiments, the lateral dimension of the semiconductor die 2' is greater than the lateral dimension of the semiconductor die 112. In some other embodiments, not shown in figures, the semiconductor die 2' and the second semiconductor dies 112 are substantially identical in lateral dimension. Furthermore, in the singulated package structure 96 shown in FIG. 14, sidewalls of the gap filling material, such as the etch stop layer 60 and the dielectric layer 62, are substantially aligned with sidewalls of the semiconductor die 2'.

FIG. 15 schematically illustrates a face-to-back SoIC structure, in which the semiconductor dies 112 have their active surfaces or front surfaces facing the active surface or back surface of the semiconductor die 4. The semiconductor die 4 may include TSVs 16, which extends through the semiconductor substrate 20 and the dielectric layer 17. The dashed region 19 shown in FIG. 15 represents the likely conductive terminals such as solder regions. In some embodiments, a CMP is performed on the TSVs 16 and the dielectric layer 17.

Figure 16:
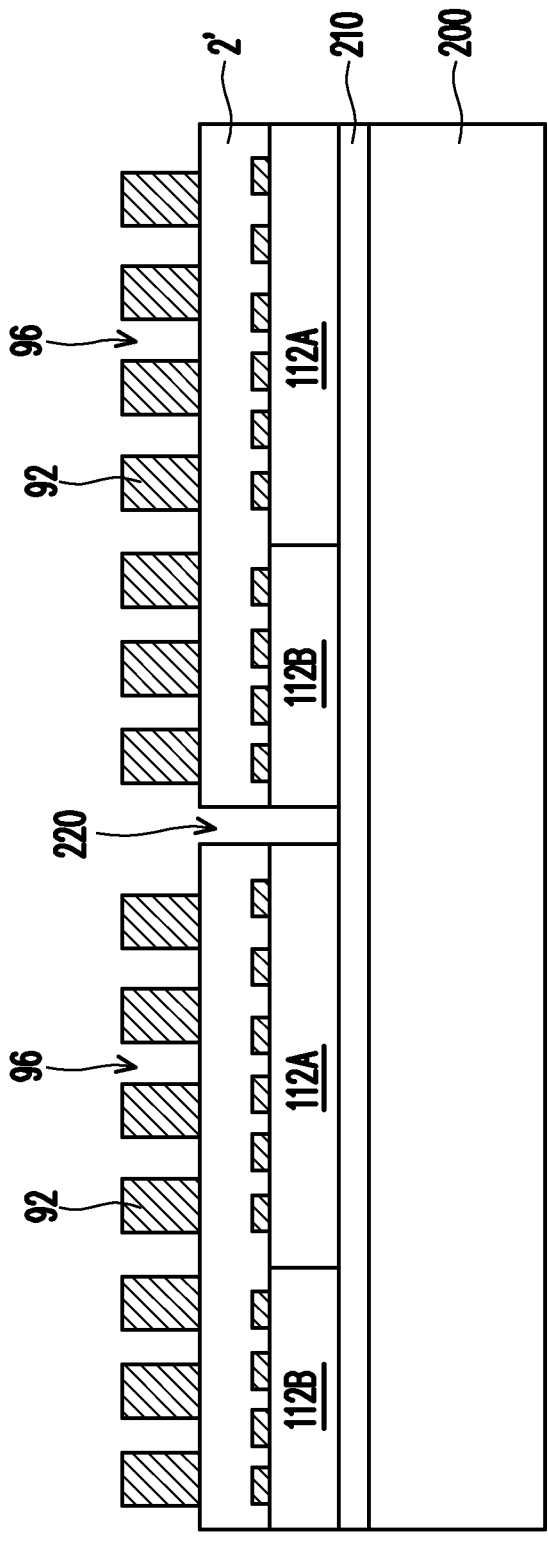

Referring to FIG. 16, a carrier 200 is provided, and a die-attachment film 210 is formed on the carrier C. The carrier 200 may be a glass carrier, a ceramic carrier, or the like. The carrier 200 may be a wafer, such that multiple package structures 96 can be placed over the carrier C. The die-attachment film 210 may be formed of a polymer-based material, which may be removed along with the carrier C from the overlying structures that will be formed in subsequent steps. In some embodiments, the die-attachment film 210 is an epoxy-based thermal-release material, which loses its adhesive property when heated, such as a light-to-heat-conversion (LTHC) release coating. In other embodiments, the die-attachment film 210 may be an ultra-violet (UV) glue, which loses its adhesive property when exposed to UV light. The die-attachment film 210 may be dispensed as a liquid and cured, may be a laminate film laminated onto the carrier C, or may be the like. The top surface of the die-attachment film 210 may be leveled and may have a high degree of planarity.

The singulated package structures 96 each having conductive posts 92 formed thereon are picked and placed onto the die-attachment film 210 carried by the carrier 200. In the singulated package structures 96, the semiconductor die 2' includes an active surface and a rear surface opposite to the active surface, the at least one semiconductor die 112 is bonded to the active surface of the semiconductor die 2', and the conductive posts 92 are distributed on the rear surface of the semiconductor die 2'. In some embodiments, after the singulated package structures 96 are picked and placed on to the die-attachment film 210, the semiconductor die 2' in the singulated package structures 96 is adhered with the carrier 200 by the die-attachment film 210. Furthermore, the singulated package structures 96 may be arranged on the die-attachment film 210 in a side-by-side manner, and the neighboring package structures 96 are spaced apart from each other by gaps 220.

Figure 17:
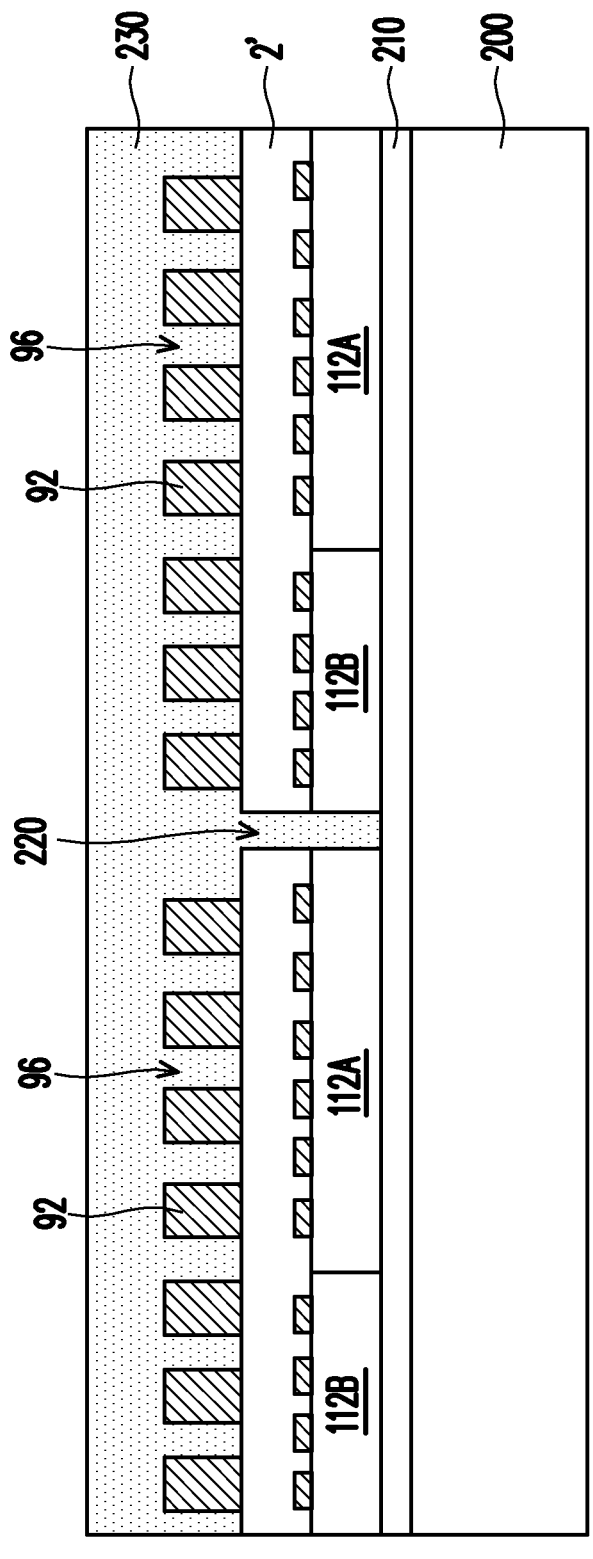

Referring to FIG. 17, an insulating material 230 is formed on the die-attachment film 210 to cover the singulated package structures 96. The insulating material 230 fills the gaps 220 between the neighboring package structures 96. The insulating material 230 is in contact with portions of the die-attachment film 210. The conductive posts 92 of the singulated package structures 96 are encapsulated by the insulating material 230. In other words, the top surface of the insulating material 230 is higher than the top surfaces of the conductive posts 92 such that the conductive posts 92 are not revealed at this stage. In some embodiments, the insulating material 230 is a molding compound formed by an over-molding process (e.g., compression molding, transfer molding, or the like). After forming the insulating material 230, sidewalls and top surfaces of the singulated package structures 96 are covered by the insulating material 230. For example, the insulating material 230 includes epoxy having filler distributed therein or other suitable dielectric materials.

Figure 18:
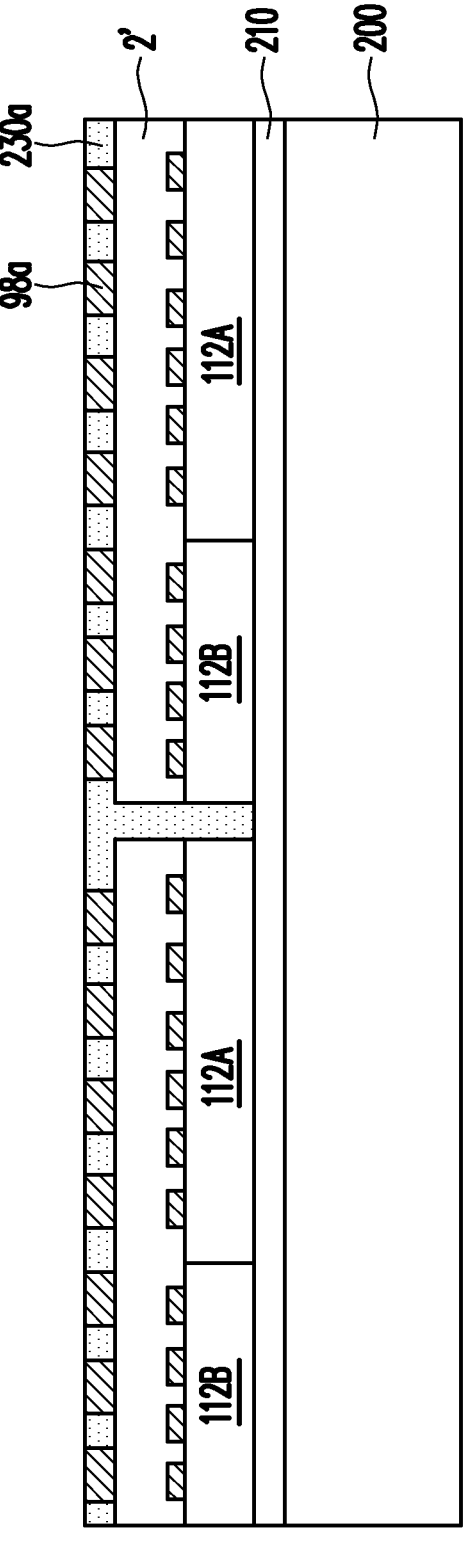

Referring to FIG. 17 and FIG. 18, the insulating material 230 and the conductive posts 92 are then ground to form an insulating encapsulation 230a and embedded portions 98a embedded in the insulating encapsulation 230a. The insulating encapsulation 230a serves as a gap filling material for filling the gaps 220 between the neighboring package structures 96. In some embodiments, the insulating material 230 is ground by a mechanical grinding process and/or a chemical mechanical polishing (CMP) process. After performing the grinding process, portions of the insulating material 230 and portions of the conductive posts 92 are simultaneously removed such that the insulating encapsulation 230a and the embedded portions 98a are formed. The top surfaces of the embedded portions 98a are revealed from the insulating encapsulation 230a. The insulating encapsulation 230a laterally encapsulates the package structures 96 (i.e., the die stack structure). The top surfaces of the embedded portions 98a substantially level with the top surface of the insulating encapsulation 230a. Through the above-mentioned grinding process, the coplanarity of the embedded portions 98a may be reduced to less than about 5 micrometers.

Figure 19:
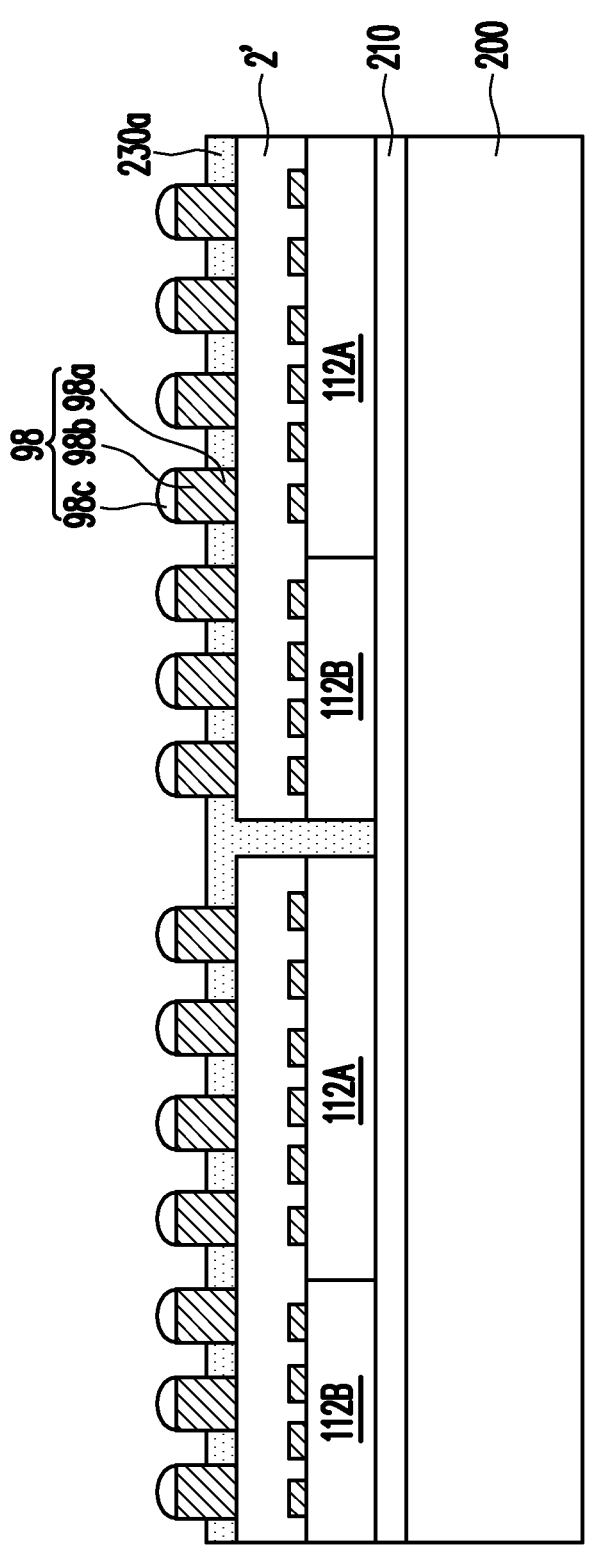

Referring to FIG. 19, after forming the insulating encapsulation 230a and the embedded portions 98a, protruding portions 98b and cap layers 98c are formed over the embedded portions 98a. In some embodiments, the protruding portions 98b and the cap layers 98c are formed through a plating process. The protruding portions 98b and the cap layers 98c may protrude from a surface of the insulating encapsulation 230a. A patterned seed layer SL (shown in FIG. 20) for performing the above-mentioned plating process may be formed between the protruding portions 98b and the embedded portions 98a. For example, the protruding portions 98b include non-solder parts, which are not molten in the subsequent reflow processes. The non-solder parts may be formed of copper, and hence are referred to as copper bumps hereinafter, although they may be formed of other non-solder materials. Each of the protruding portions 98b may also include a cap layer 98c selected from a nickel layer, a nickel alloy, a palladium layer, a gold layer, a silver layer, or multi-layers thereof. The cap layers 98c are formed on the protruding portions 98b. The cap layers 98c may be solder caps, which may be formed of a Sn—Ag alloy, a Sn—Cu alloy, a Sn—Ag—Cu alloy, or the like, and may be lead-free or lead-containing.

In some embodiments, the overall height of the protruding portions 98b and the cap layers 98c ranges from about 10 micrometers to about 30 micrometers. Furthermore, the coplanarity of the protruding portions 98b and/or the cap layers 98c may be controlled to be less than about 5 micrometers. In other words, the height-level offset between the top surfaces of the cap layers 98c may be less than about 5 micrometers. The embedded portions 98a, the protruding portions 98b and the cap layers 98c are collectively referred as conductive terminals 98. The insulating encapsulation 230a covers the rear surface of the semiconductor die 2' and is in contact with the conductive terminals 98. The at least one semiconductor die 112 is spaced apart from the conductive terminals 98 by the semiconductor die 2'. After forming the protruding portions 98b and the cap layers 98c, a re-constructed wafer form structure is formed.

Figure 20:
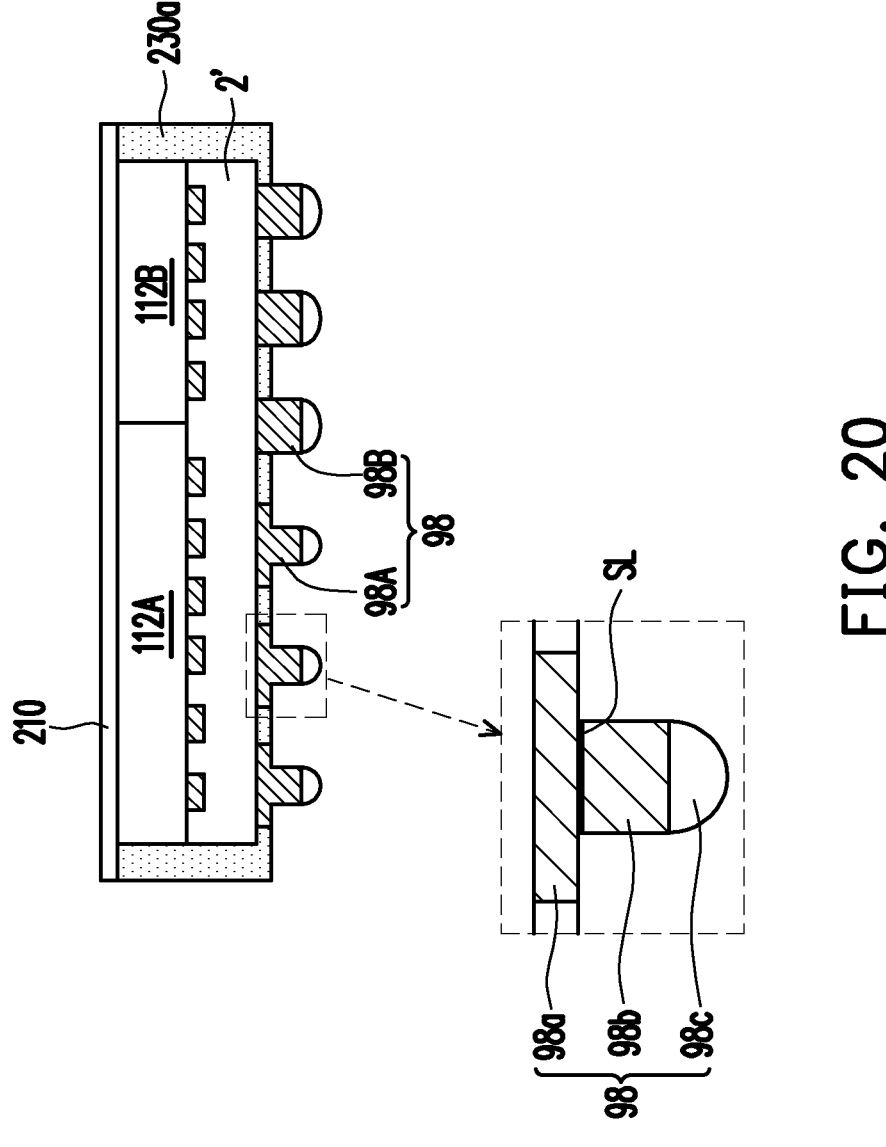
FIG. 20 schematically illustrates a cross-sectional view of a SoIC structure in accordance with some embodiments.

FIG. 20 schematically illustrates a cross-sectional view of a singulated SoIC structure SS1 in accordance with some embodiments.

Referring to FIG. 19 and FIG. 20, after forming the protruding portions 98b and the cap layers 98c, a singulation process is performed to singulate the re-constructed wafer form structure illustrated in FIG. 19 into multiple singulated SoIC structures SS1. In the singulated SoIC structures SS1, the die-attachment film 210 is attached with the semiconductor dies 112A, the semiconductor die 112B and the insulating encapsulation 230a. The conductive terminals 98 of the singulated SoIC structure SS1 shown in FIG. 20 may include first conductive terminals 98A and second conductive terminals 98B, and the width of the first conductive terminals 98A is different from the width of the second conductive terminals 98B. For example, the width of the first conductive terminals 98A is greater than the width of the second conductive terminals 98B. The first conductive terminals 98A and the second conductive terminals 98B may be arranged over the semiconductor die 2', and the arrangement pitch of the first conductive terminals 98A is the same as the arrangement pitch of the second conductive terminals 98B. The first conductive terminals 98A and the second conductive terminals 98B are distributed in different layout regions of the semiconductor die 2'. In some other embodiments, not shown in figures, the first conductive terminals 98A and the second conductive terminals 98B are substantially identical in width.

Figure 21:
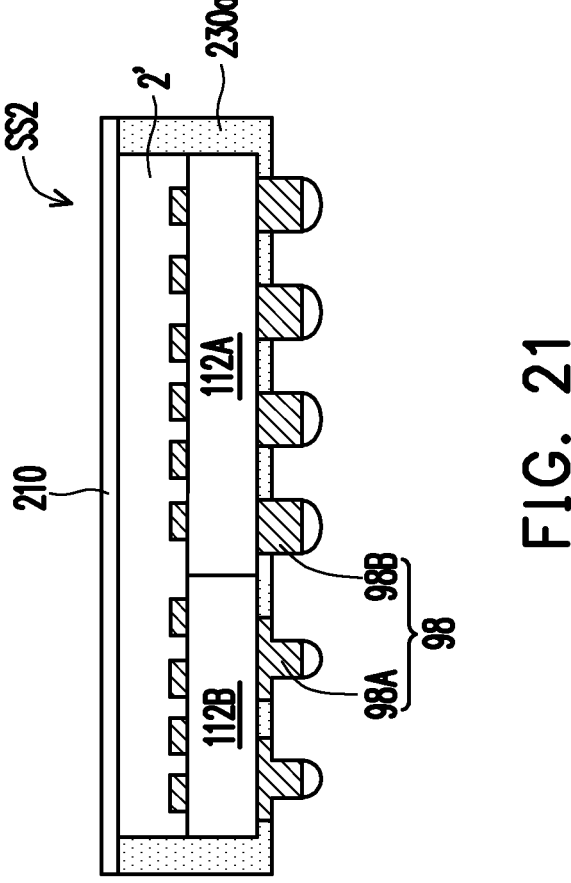
FIG. 21 schematically illustrates a cross-sectional view of a singulated SoIC structure SS2 in accordance with some other embodiments.

FIG. 21 schematically illustrates a cross-sectional view of a singulated SoIC structure SS2 in accordance with some other embodiments.

Referring to FIG. 21, in the singulated SoIC structure SS2, the first conductive terminals 98A and the second conductive terminals 98B with different widths are distributed on layout regions of the semiconductor die 112A and the semiconductor die 112B, respectively. In some alternative embodiments, the first conductive terminals 98A and the second conductive terminals 98B with identical width are distributed on the semiconductor die 112A and the semiconductor die 112B, respectively. In some other embodiments, not illustrated in figures, the first conductive terminals 98A arranged over the semiconductor die 112A have different widths or are identical in width, and the second conductive terminals 98B arranged over the semiconductor die 112B have different widths or are identical in width.

Figure 22:
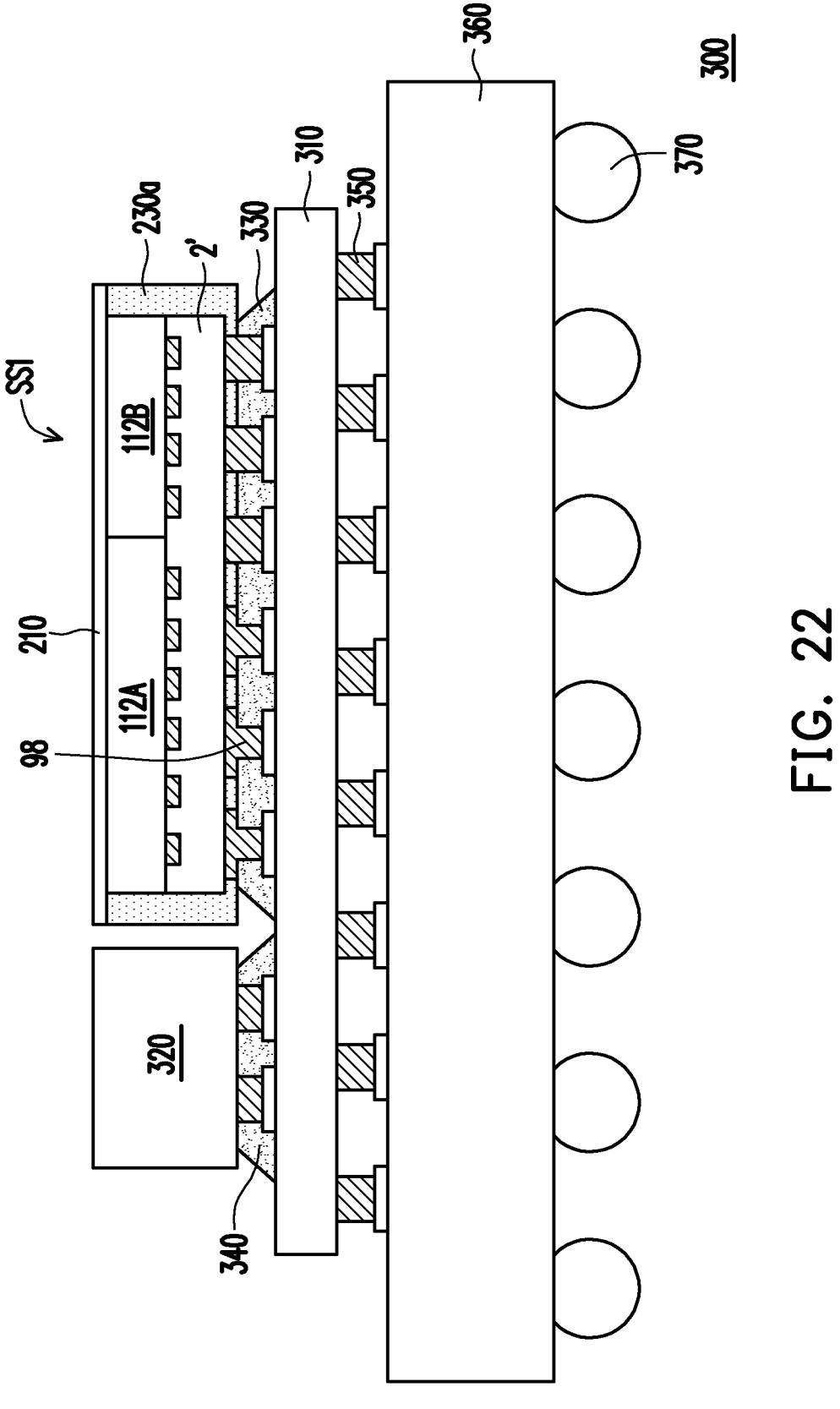
FIG. 22 schematically illustrates a Chip-on-Wafer-on-Substrate (CoWoS) structure including the SoIC structure shown in FIG. 20 in accordance with some embodiments.

FIG. 22 schematically illustrates a Chip-on-Wafer-on-Substrate (CoWoS) structure 300 including the singulated SoIC structure SS1 shown in FIG. 20 in accordance with some embodiments.

Referring to FIG. 22, the CoWoS structure 300 in accordance with an embodiment of the present invention includes the singulated SoIC structure SS1 shown in FIG. 20, an interposer substrate 310, at least one memory device 320, a first underfill 330, a second underfill 340, conductive terminals 350, a wiring substrate 360 and conductive balls 370. The interposer substrate 310 may be or include a silicon interposer, an organic interposer, an interposer with local silicon interconnect embedded therein or the like. The memory device 320 may be or include a high-bandwidth memory device or the like. The singulated SoIC structure SS1 and the memory device 320 are disposed over and electrically connected to the interposer substrate 310 through the conductive terminals 98 (e.g., micro-bumps or the like). The first underfill 330 is disposed on the interposer substrate 310 to laterally encapsulate the conductive terminals 98 and fills the gap between the interposer substrate 310 and the singulated SoIC structure SS1. The second underfill 340 is disposed on the interposer substrate 310 and fills the gap between the interposer substrate 310 and the memory device 320. The conductive terminals 350 are disposed on the bottom surface of the interposer substrate 310. The conductive terminals 350 may be controlled collapse chip connection (C4) bumps or the like. The conductive terminals 350 and the SoIC structure SS1 are respectively disposed on opposite sides of the interposer substrate 310. The interposer substrate 310 is disposed on the wiring substrate 360 and is electrically connected to the wiring substrate 360 through the conductive terminals 350. The conductive balls 370 (e.g., solder balls or the like) are disposed on the bottom surface of the wiring substrate 360. The conductive balls 370 and the conductive terminals 350 are disposed on opposite sides of the wiring substrate 360.

Figure 23:
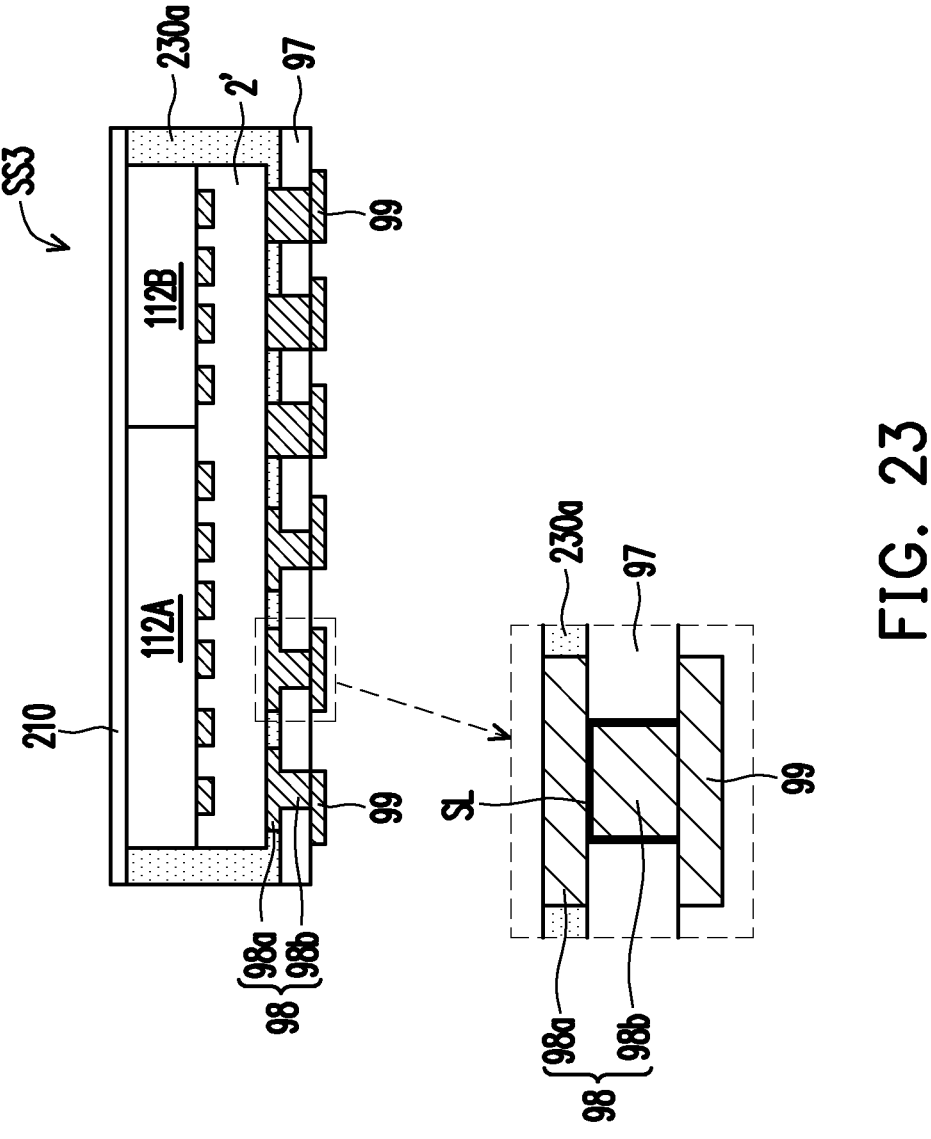
FIG. 23 schematically illustrates a cross-sectional view of a SoIC structure in accordance with some other embodiments.

FIG. 23 schematically illustrates a cross-sectional view of a SoIC structure SS3 accordance with some other embodiments.

Referring to FIG. 20 and FIG. 23, the SoIC structure SS3 illustrated in FIG. 23 is similar to the SoIC structure SS1 illustrated in FIG. 20 except that the SoIC structure SS3 further includes a protective layer 97 laterally encapsulating the embedded portions 98b and redistribution wirings 99 disposed on a surface of the protective layer 97. The redistribution wirings 99 are electrically connected to the embedded portions 98b. The redistribution wirings 99 are physically in contact with the redistribution wirings 99 and the protective layer 97. A series of fan-out package process may be performed to pack the SoIC structure SS3 to form an Integrated Fan-out (InFO) structure.

In the above-mentioned embodiments, a re-construction process is performed to minimize the coplanarity of the conductive terminals (e.g., the conductive terminals 98) of the SoIC structures (e.g., the SoIC structures SS1, SS2 or SS3), and accordingly, reliability and yield rates of the package structure including the SoIC structures (e.g., the SoIC structures SS1, SS2 or SS3) can be significantly enhanced.

In accordance with some embodiments of the disclosure, a package structure including a first semiconductor die, at least one second semiconductor die, conductive terminals and an insulating encapsulation is provided. The at least one second semiconductor die is stacked on and electrically connected to the first semiconductor die. The conductive terminals are disposed on and electrically connected to the first semiconductor die. The insulating encapsulation laterally encapsulates the first semiconductor die, the at least one second semiconductor die and the conductive terminals, wherein the conductive terminals protrude from a surface of the insulating encapsulation. In some embodiments, the at least one second semiconductor die is spaced apart from the conductive terminals by the first semiconductor die. In some embodiments, the first semiconductor die includes a first surface and a second surface opposite to the first surface, the at least one second semiconductor die is bonded to the first surface of the first semiconductor die, and the conductive terminals are distributed on the second surface of the first semiconductor die. In some embodiments, the insulating encapsulation covers the second surface of the first semiconductor die and is in contact with the conductive terminals. In some embodiments, the conductive terminals each includes an embedded portion and a protruding portion disposed on the embedded portion, wherein the embedded portion is laterally encapsulated by the insulating encapsulation, and the protruding portion protrudes from the surface of the insulating encapsulation. In some embodiments, the conductive terminals include first conductive terminals and second conductive terminals, a first width of the first conductive terminals is different from a second width of the second conductive terminals. In some embodiments, the package structure further includes a die-attachment film attached with the at least one second semiconductor die and the insulating encapsulation. In some embodiments, the first semiconductor die and the at least one second semiconductor die are substantially identical in lateral dimension. In some embodiments, a first lateral dimension of the first semiconductor die is greater than a second lateral dimension of the at least one second semiconductor die.

In accordance with some other embodiments of the disclosure, a package structure including a first semiconductor die, a second semiconductor die, a third semiconductor die, a gap filling material, conductive terminals and an insulating encapsulation is provided. The second semiconductor die is stacked on the first semiconductor die. The third semiconductor die is stacked on the first semiconductor die, wherein the second semiconductor die and the third semiconductor die are electrically connected to the first semiconductor die. The gap filling material is disposed on the first semiconductor die and laterally encapsulates the second semiconductor die and the third semiconductor die, wherein sidewalls of the gap filling material are substantially aligned with sidewalls of the first semiconductor die. The conductive terminals are disposed on the first semiconductor die or disposed on the second semiconductor die and the third semiconductor die. The insulating encapsulation laterally encapsulates the first semiconductor die, the gap filling material and the conductive terminals. In some embodiments, the second semiconductor die and the third semiconductor die are spaced apart from the conductive terminals by the first semiconductor die. In some embodiments, the conductive terminals each includes an embedded portion and a protruding portion disposed on the embedded portion, wherein the embedded portion is laterally encapsulated by the insulating encapsulation, and the protruding portion protrudes from the insulating encapsulation. In some embodiments, the conductive terminals include first conductive terminals and second conductive terminals, a first width of the first conductive terminals is different from a second width of the second conductive terminals. In some embodiments, the package structure further includes a die attachment film attached with the second semiconductor die, the third semiconductor die, the gap filling material and the insulating encapsulation. In some embodiments, a first lateral dimension of the first semiconductor die is greater than a second lateral dimension of the second semiconductor die and a third lateral dimension of the third semiconductor die.

In accordance with some other embodiments of the disclosure, a method including the following is provided. A die stack structure is placed on a carrier, wherein the die stack structure includes a first semiconductor die, at least one second semiconductor die stacked on and electrically connected to the first semiconductor die, and conductive posts disposed on and electrically connected to the first semiconductor die. An insulating material is formed on the carrier to cover the die stack structure. The insulating material and the conductive posts are partially removed to form an insulating encapsulation and embedded portions laterally encapsulated by the insulating encapsulation. Protruding portions are formed on the embedded portions. In some embodiments, a coplanarity of the conductive posts range from about 20 micrometers to about 30 micrometers. In some embodiments, the insulating material and the conductive posts are partially removed through a chemical mechanical polishing process. In some embodiments, a top surface of the insulating encapsulation and top surfaces of the embedded portions are substantially coplanar. In some embodiments, the protruding portions are formed through a plating process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a first semiconductor die;
at least one second semiconductor die stacked on and electrically connected to the first semiconductor die;
conductive terminals disposed on and electrically connected to the first semiconductor die, wherein the at least one second semiconductor die is disposed at a first side of the first semiconductor die, the conductive terminals are disposed at a second side of the first semiconductor die, and the first side is opposite to the second side; and
an insulating encapsulation laterally encapsulating the first semiconductor die, the at least one second semiconductor die and the conductive terminals, wherein the conductive terminals protrude from a surface of the insulating encapsulation.

2. The package structure as claimed in claim 1, wherein the at least one second semiconductor die is spaced apart from the conductive terminals by the first semiconductor die.

3. The package structure as claimed in claim 1, wherein the first semiconductor die comprises a first surface and a second surface opposite to the first surface, the at least one second semiconductor die is bonded to the first surface of the first semiconductor die, and the conductive terminals are distributed on the second surface of the first semiconductor die.

4. The package structure as claimed in claim 3, wherein the insulating encapsulation covers the second surface of the first semiconductor die and is in contact with the conductive terminals.

5. The package structure as claimed in claim 1, wherein the conductive terminals each comprises:
an embedded portion; and
a protruding portion disposed on the embedded portion, the embedded portion is laterally encapsulated by the insulating encapsulation, and the protruding portion protrudes from the surface of the insulating encapsulation.

6. The package structure as claimed in claim 1, wherein the conductive terminals comprise first conductive terminals and second conductive terminals, a first width of the first conductive terminals is different from a second width of the second conductive terminals.

7. The package structure as claimed in claim 1 further comprising:
a die-attachment film attached with the at least one second semiconductor die and the insulating encapsulation.

8. The package structure as claimed in claim 1, wherein the first semiconductor die and the at least one second semiconductor die are substantially identical in lateral dimension.

9. The package structure as claimed in claim 1, wherein a first lateral dimension of the first semiconductor die is greater than a second lateral dimension of the at least one second semiconductor die.

10. A package structure, comprising:
a first semiconductor die;
a second semiconductor die stacked on the first semiconductor die;
a third semiconductor die stacked on the first semiconductor die, wherein the second semiconductor die and the third semiconductor die are electrically connected to the first semiconductor die;
a gap filling material disposed on the first semiconductor die and laterally encapsulating the second semiconductor die and the third semiconductor die, and sidewalls of the gap filling material being substantially aligned with sidewalls of the first semiconductor die;
conductive terminals disposed on the first semiconductor die or disposed on the second semiconductor die and the third semiconductor die; and
an insulating encapsulation laterally encapsulating the first semiconductor die, the gap filling material and the conductive terminals.

11. The package structure as claimed in claim 10, wherein the second semiconductor die and the third semiconductor die are spaced apart from the conductive terminals by the first semiconductor die.

12. The package structure as claimed in claim 10, wherein the conductive terminals each comprises:
an embedded portion; and
a protruding portion disposed on the embedded portion, the embedded portion is laterally encapsulated by the insulating encapsulation, and the protruding portion protrudes from the insulating encapsulation.

13. The package structure as claimed in claim 10, wherein the conductive terminals comprise first conductive terminals and second conductive terminals, a first width of the first conductive terminals is different from a second width of the second conductive terminals.

14. The package structure as claimed in claim 10 further comprising:
a die-attachment film attached with the second semiconductor die, the third semiconductor die, the gap filling material and the insulating encapsulation.

15. The package structure as claimed in claim 10, wherein a first lateral dimension of the first semiconductor die is greater than a second lateral dimension of the second semiconductor die and a third lateral dimension of the third semiconductor die.

16. A method, comprising:
placing a die stack structure on a carrier, the die stack structure comprising a first semiconductor die, at least one second semiconductor die stacked on and electrically connected to the first semiconductor die, and conductive posts disposed on and electrically connected to the first semiconductor die;
forming an insulating material on the carrier to cover the die stack structure;
partially removing the insulating material and the conductive posts to form an insulating encapsulation and embedded portions laterally encapsulated by the insulating encapsulation; and
forming protruding portions on the embedded portions.

17. The method as claimed in claim 16, wherein a coplanarity of the conductive posts range from about 20 micrometers to about 30 micrometers.

18. The method as claimed in claim 16, wherein the insulating material and the conductive posts are partially removed through a chemical mechanical polishing process.

19. The method as claimed in claim 16, wherein a top surface of the insulating encapsulation and top surfaces of the embedded portions are substantially coplanar.

20. The method as claimed in claim 16, wherein the protruding portions are formed through a plating process.

\* \* \* \* \*